United States Patent
Doornbos et al.

(10) Patent No.: US 12,414,303 B2
(45) Date of Patent: Sep. 9, 2025

(54) FERROELECTRIC DEVICE AND WAVE COMPUTING DEVICE

(71) Applicant: Taiwan Semiconductor Manufacturing Company, Ltd., Hsinchu (TW)

(72) Inventors: Gerben Doornbos, Kessel-Lo (BE); Georgios Vellianitis, Heverlee (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 517 days.

(21) Appl. No.: 17/887,515

(22) Filed: Aug. 15, 2022

(65) Prior Publication Data

US 2024/0057341 A1  Feb. 15, 2024

(51) Int. Cl.
*H10B 51/10* (2023.01)
*H10N 30/03* (2023.01)

(52) U.S. Cl.
CPC ............. *H10B 51/10* (2023.02); *H10N 30/03* (2023.02)

(58) Field of Classification Search
CPC ....... G11C 11/00; G11C 11/22; G11C 11/221; G11C 11/223; H01L 29/40111; H01L 28/55; H01L 2924/1441; H10B 51/00; H10B 53/00
See application file for complete search history.

(56) References Cited

U.S. PATENT DOCUMENTS

2020/0041825 A1* 2/2020 Han ...................... G02F 1/0508

OTHER PUBLICATIONS

Abdulqader Mahmoud et al., "Introduction to spin wave computing", Journal of Applied Physics, Oct. 22, 2020, pp. 1-45.
Milan Pešić et al., "A Computational Study of Hafnia based Ferroelectric Memories: From Ab-initio via Physical Modeling to Circuit Models of Ferroelectric Device", Journal of Computational Electronics, vol. 16, Issue 4, Dec. 1, 2017, pp. 1-24.
Morito Akiyama et al., "Influence of scandium concentration on power generation figure of merit of scandium aluminum nitride thin films", Applied Physics Letters, Jan. 18, 2013, pp. 1-5.
Simon Fichtner et al., "AlScN: A III-V semiconductor based ferroelectric", Journal of Applied Physics, Mar. 18, 2019, pp. 1-8.

* cited by examiner

*Primary Examiner* — Joshua Benitez Rosario
*Assistant Examiner* — Moataz Khalifa
(74) *Attorney, Agent, or Firm* — JCIPRNET

(57) ABSTRACT

A ferroelectric device and a wave computing device are provided. The ferroelectric device includes a first electrode, a second electrode, a ferroelectric layer and a wave guide. The ferroelectric layer is disposed between the first and second electrodes, and configured to transduce an electrical wave signal to a varying mechanical stress by piezoelectricity, or vice versa. A first polarization state or a second polarization state opposite to the first polarization state is programmed in the ferroelectric layer. The wave guide is in contact with the ferroelectric layer, and configured to transmit a wave signal resulted from or resulting the varying mechanical stress. The wave signal is in phase with the electrical wave signal when the ferroelectric layer is programmed with the first polarization state. The wave signal is out of phase with the electrical wave signal when the ferroelectric layer is programmed with the second polarization state.

20 Claims, 18 Drawing Sheets

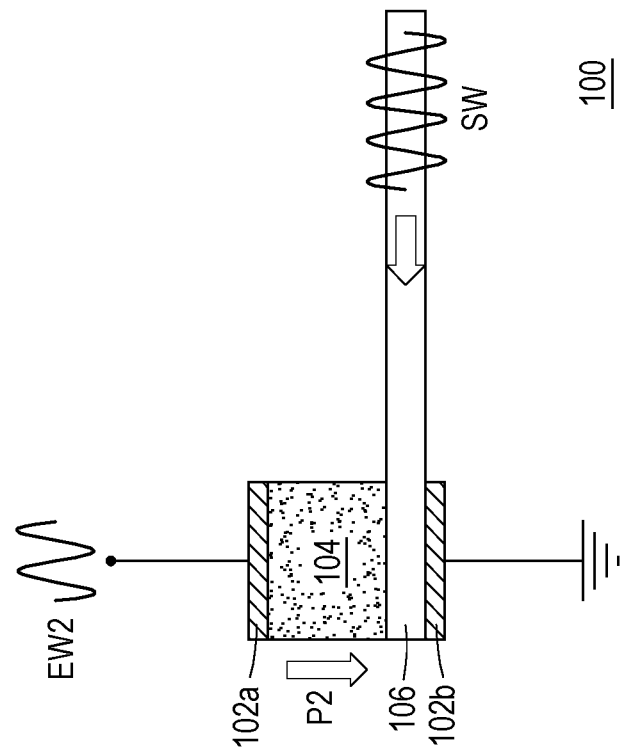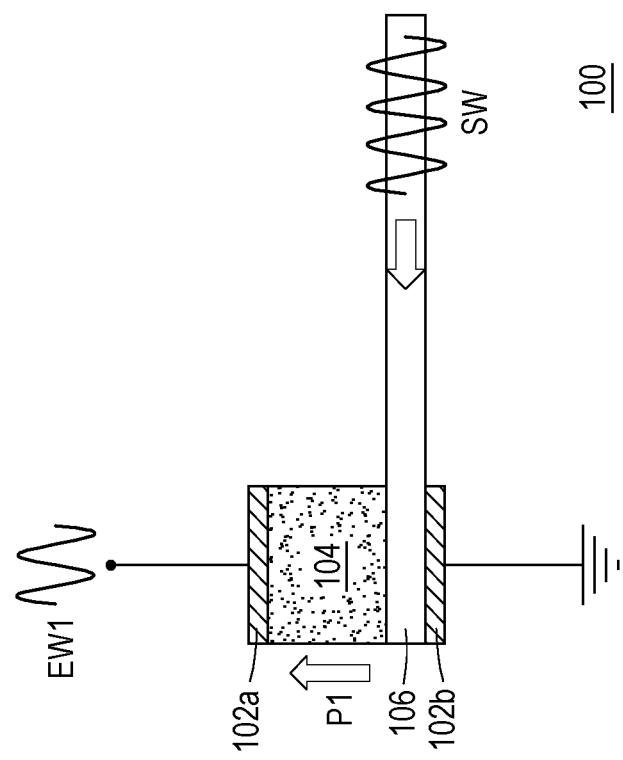
FIG. 1C
FIG. 1D

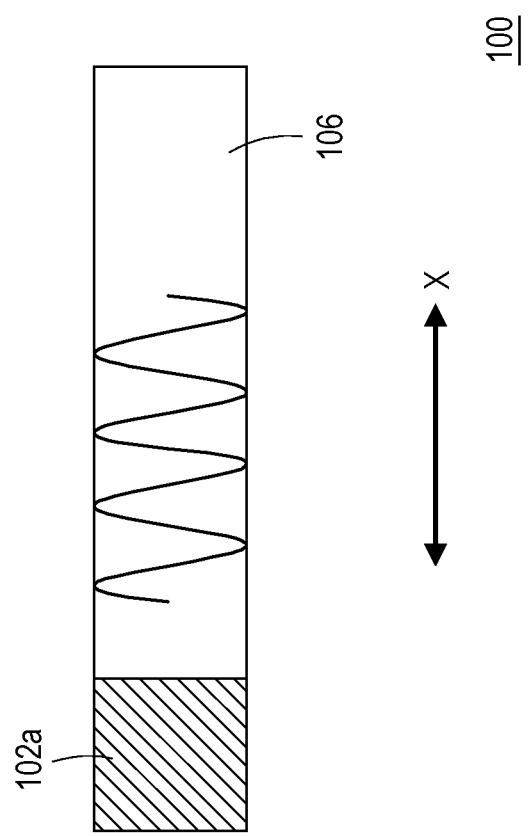

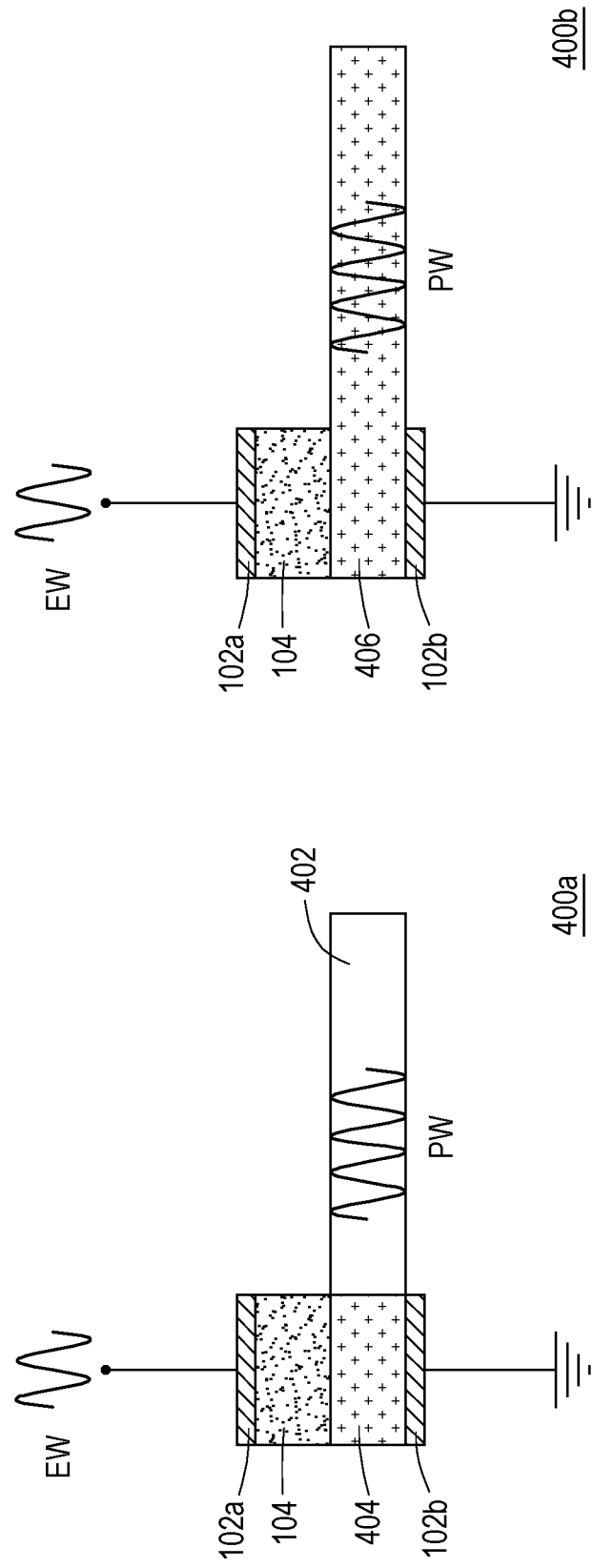

FERROELECTRIC DEVICE AND WAVE COMPUTING DEVICE

BACKGROUND

Most computing systems rely on paradigms, in which data is represented by electric charge or voltage, and computation is performed by charge movements. A fundamental circuit element of this framework is a field effect transistor (FET), which can be functioned as a switch and/or an amplifier. A plurality of the FETs with complementary conductive types can be interconnected to form a complementary metal-oxide-semiconductor (CMOS) circuit that can be operated to perform various logic functions. For many years, scaling of the CMOS circuit has been accompanied by research on alternative computing paradigms beyond the CMOS horizon.

Wave computing is one of the beyond-CMOS approaches. In a paradigm of wave computing, data is encoded in amplitude and/or phase of a wave, and computation is done by wave interference. Inversion of a signal is essential in wave computing. However, inversion of a wave signal is typically implemented by propagating the wave along a delay line, or by interference with a reference wave. Both of these implementations cost valuable chip area and may be undesired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C and FIG. 1D are schematic cross-sectional views illustrating a ferroelectric device being used to generate electrical wave signals in response to an input of a sound wave signal, according to some embodiments of the present disclosure.

FIG. 2A through FIG. 2E illustrate various layout designs of a ferroelectric device, according to some embodiment of the present disclosure.

FIG. 4A is a schematic cross-sectional view illustrating a ferroelectric device, according to some embodiments of the present disclosure.

FIG. 4B is a schematic cross-sectional view illustrating a ferroelectric device, according to some embodiments of the present disclosure.

DETAILED DESCRIPTION

Figure 1B:
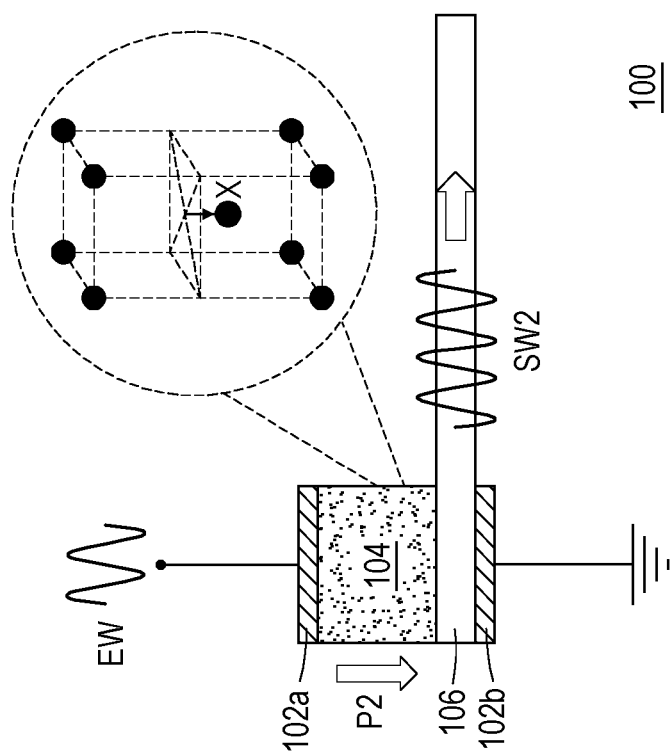
FIG. 1A and FIG. 1B are schematic cross-sectional views illustrating a ferroelectric device at different polarization states, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following, signals, or waves, or wave signals, being either "in phase" or "out of phase" refers to coherent waves having a phase difference of nominally zero degrees, or coherent waves having a phase difference of nominally 180° (or pi radials, or half a period), respectively.

Ferroelectric devices used in a paradigm of wave computing are provided in various embodiments of the present disclosure. The ferroelectric devices are reconfigurable transducers (input actuators or output sensors), and can be interconnected to form a logic gate, a differential wave generator, an error correction device or other wave computing devices. Specifically, each ferroelectric device can either pass a wave signal or invert the wave signal (in terms of phase), depending on a pre-programmed polarization state of the ferroelectric device. When a ferroelectric device is configured to invert a wave signal, the wave signal can be inverted at the ferroelectric device, without propagation along a delay line, or interference with a reference wave.

Figure 1A:
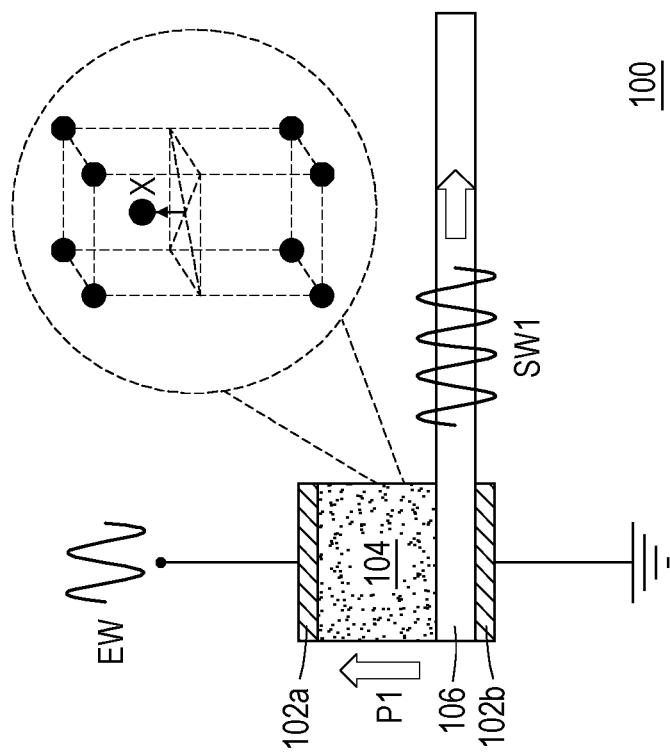

FIG. 1A and FIG. 1B are schematic cross-sectional views illustrating a ferroelectric device 100 at different polarization states P1, P2, according to some embodiments of the present disclosure.

Referring to FIG. 1A and FIG. 1B, the ferroelectric device 100 as a wave transducer includes a pair of electrodes 102a, 102b, and includes a ferroelectric layer 104 as well as a wave guide 106 lying between the electrodes 102a, 102b. According to some embodiments, the ferroelectric device 100 is an input actuator, and the electrode 102a is configured to receive an electrical wave signal EW. The electrical wave signal EW is an AC voltage signal, such as a radio frequency (RF) voltage signal. On the other hand, the electrode 102b may be coupled to a reference voltage, such as a ground voltage.

The ferroelectric layer 104 lies between the electrode 102a and the wave guide 106, and is formed of a ferroelectric material. Due to ferroelectricity of the ferroelectric material, the ferroelectric layer 104 can possess reversible electric polarization. Further, the ferroelectricity may be related to atom displacement. As shown in FIG. 1A, the ferroelectric layer 104 is programmed with a polarization state P1, and an atom X in a unit cell in of the ferroelectric layer 104 may be displaced upwardly from a lattice site. On the other hand, as shown in FIG. 1B, the ferroelectric layer 104 is programmed with a polarization state P2 opposite to the polarization state P1 in terms of direction, and the atom X in the unit cell of the ferroelectric layer 104 is displaced downwardly from the lattice site. In either case, a lattice constant of the ferroelectric layer 104 changes with variation of an electric field applied across the ferroelectric layer 104, such as a varying electric field provided by the electrical wave signal EW. Depending on the polarization states P1, P2, the lattice constant of the ferroelectric layer 104 may change in opposite ways with respect to variation of the electric field applied across the ferroelectric layer 104. As an example, when the ferroelectric layer 104 is programmed with the polarization state P1, the lattice constant of the ferroelectric layer 104 may increase/decrease as the electric field applied across the ferroelectric layer 104 also increases/decreases. In other words, the lattice constant variation of the ferroelectric layer 104 programmed with the polarization state P1 may be in phase with the varying electric field. On the other hand, when the ferroelectric layer 104 is programmed with the polarization state P2, the lattice constant of the ferroelectric layer 104 may increase as the electric field applied across the ferroelectric layer 104 decreases, and may decrease as the electric field increases. In other words, the lattice constant variation of the ferroelectric layer 104 programmed with the polarization state P2 may be 180° out of phase with respect to the varying electric field.

The lattice constant variation of the ferroelectric layer 104 in response to the varying electric field provided by the electrical wave signal EW results in varying mechanical stress applied to the wave guide 106 extending between the ferroelectric layer 104 and the electrode 102b. In other words, an electrical energy is transduced to a mechanical energy by a piezoelectricity (inverse piezoelectricity) of the ferroelectric layer 104. As a result of such transduction, a sound wave signal SW1/SW2 created by collective atom displacement may be generated in the wave guide 106, and travels along the wave guide 106. When the ferroelectric layer 104 is programmed with the polarization state P1, the lattice constant variation of the ferroelectric layer 104 may be in phase with the varying electric field provided by the electrical wave signal EW, thus the sound wave signal SW1 created in the wave guide 106 may be in phase with the varying electric field as well. On the other hand, when the ferroelectric layer 104 is programmed with the polarization state P2, the lattice constant variation of the ferroelectric layer 104 may be out of phase with respect to the varying electric field, then the sound wave signal SW2 created in the wave guide 106 may also be out of phase with respect to the varying electric field. Therefore, by pre-programming the ferroelectric layer 104 with the polarization state P2, a signal provided to the ferroelectric layer 104 can be inverted by the ferroelectric layer 104, and such inversion takes place without the signal further propagating along a delay line, or interference with an additional reference signal.

Prior to the transduction, the ferroelectric layer 104 is programmed with the polarization state P1 or the polarization state P2. During a programming process, a programming voltage (e.g., a DC voltage larger than a coercive voltage of the ferroelectric layer 104) is provided across the ferroelectric layer 104. Particularly, a polarity of the programming voltage used for inducing the polarization state P1 is opposite to a polarity of the programming voltage used for inducing the polarization state P2. On the other hand, an amplitude of the programming voltage used for inducing the polarization state P1 is identical or different from an amplitude of the programming voltage used for inducing the polarization state P2. Further, an amplitude of the electrical wave signal EW provided during transduction should be lower than the amplitude(s) of the programming voltages used for inducing the polarization states P1, P2, to avoid from accidentally altering the polarization state of the ferroelectric layer 104.

The ferroelectric layer 104 is formed of a ferroelectric material possessing ferroelectricity and piezoelectricity (including direct piezoelectricity and inverse piezoelectricity). The piezoelectricity (inverse piezoelectricity) is utilized to transduce an electrical energy to a mechanical energy, and the ferroelectricity is utilized to determine whether to invert (in terms of phase) the incoming electrical wave signal. It should be appreciated that, a ferroelectric material is also a piezoelectric material, but a piezoelectric material is not necessarily a ferroelectric material. As examples, the ferroelectric layer 104 may be formed of AlScN, orthorhombic hafnium oxide, orthorhombic hafnium zirconium oxide (HZO), perovskite lead titanate, perovskite barium titanate or another suitable ferroelectric material. On the other hand, in order to transmit the sound wave signal SW1/SW2, the wave guide 106 may be formed of a crystalline material. As examples, the wave guide 106 may be formed of quartz, sapphire, diamond or metal (e.g., Al, Be, Mo, Ti or the like).

According to the above embodiments, the ferroelectric device 100 generates the sound wave signal SW1/SW2 in response to an input of the electrical wave signal EW. In other embodiments, the ferroelectric device 100 can be used to generate an electrical wave signal in response to a sound wave signal.

FIG. 1C and FIG. 1D are schematic cross-sectional views illustrating the ferroelectric device 100 being used to generate electrical wave signals EW1, EW2 in response to an input of a sound wave signal SW, according to some embodiments of the present disclosure.

Referring to FIG. 1C and FIG. 1D, according to some embodiments, the ferroelectric device 100 is functioned as an output sensor, and the wave guide 106 is configured to receive a sound wave signal SW. Due to piezoelectricity (direct piezoelectricity) of the ferroelectric layer 104, the ferroelectric layer 104 can generate an electrical wave signal EW1/EW2 while being stressed by the mechanical stress resulted from the sound wave signal SW, and the electrical wave signal EW1/EW2 may be output via the electrode 102a. On the other hand, the electrode 102b may be coupled to a reference voltage, such as a ground voltage.

Further, phases of the electrical wave signals EW1, EW2 are dependent on a pre-programmed polarization state of the ferroelectric layer 104. As shown in FIG. 1C, when the ferroelectric layer 104 is programmed with the polarization state P1, the generated electrical wave signal EW1 is in phase with the sound wave signal SW. On the other hand, as shown in FIG. 1D, the generated electrical wave signal EW2 is out of phase with the sound wave signal SW when the ferroelectric layer 104 is programmed with the polarization state P2. Particularly, the phase inversion occurs right at the ferroelectric device 100, without help of a delay line or an additional reference signal.

FIG. 2A through FIG. 2E illustrate various layout designs of the ferroelectric device 100, according to some embodiment of the present disclosure. It should be noted that, the ferroelectric layer 104 and the electrode 102b overlapped by the electrode 102a are not shown in FIG. 2A through FIG. 2E.

Referring to FIG. 2A, the wave guide 106 laterally protrudes from the electrode 102a and the underlying ferroelectric layer 104 (not shown). In some embodiments, the wave guide 106 laterally extends along a single direction X at a single side of a stacking structure including the electrode 102a and the underlying ferroelectric layer 104 (not shown). In these embodiments, a terminal of the wave guide 106 away from the stacking structure may be coupled to an input/output (I/O) of a single wave computing device, such as a logic gate.

In the embodiments as shown in FIG. 2A, the wave guide 106 has a single protruding portion. In following embodiments, the wave guide 106 has multiple protruding portions coupled to multiple wave computing devices, such as logic gates. The sound wave signal generated by the ferroelectric layer 104 (not shown) can be transmitted to these wave computing devices. Alternatively, sound wave signals from these wave computing devices can interfere with each other in the wave guide 106, and can be transduced to an electrical wave signal by the ferroelectric layer 104 (not shown).

Figure 2B:
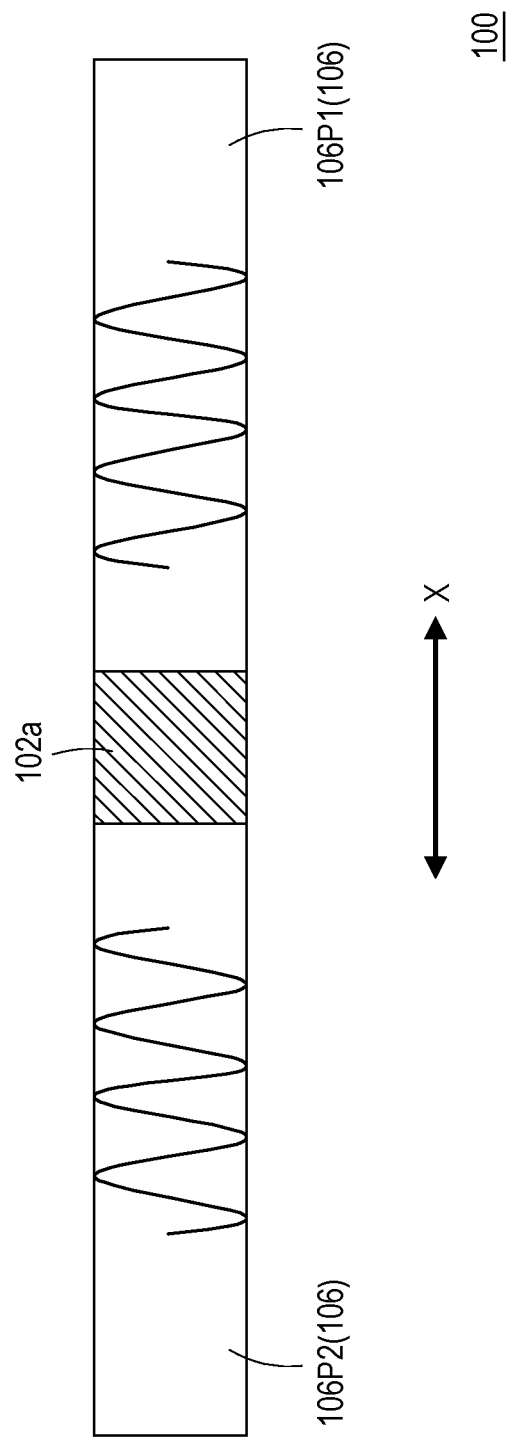

In some of these embodiments, as shown in FIG. 2B, the wave guide 106 has protruding portions 106P1, 106P2 laterally protruding from opposite sides of the stacking structure including the electrode 102a and the underlying ferroelectric layer 104 (not shown), and may extend along, for example, the direction X. In these embodiments, the wave guide 106 is formed in a line shape.

Figure 2C:
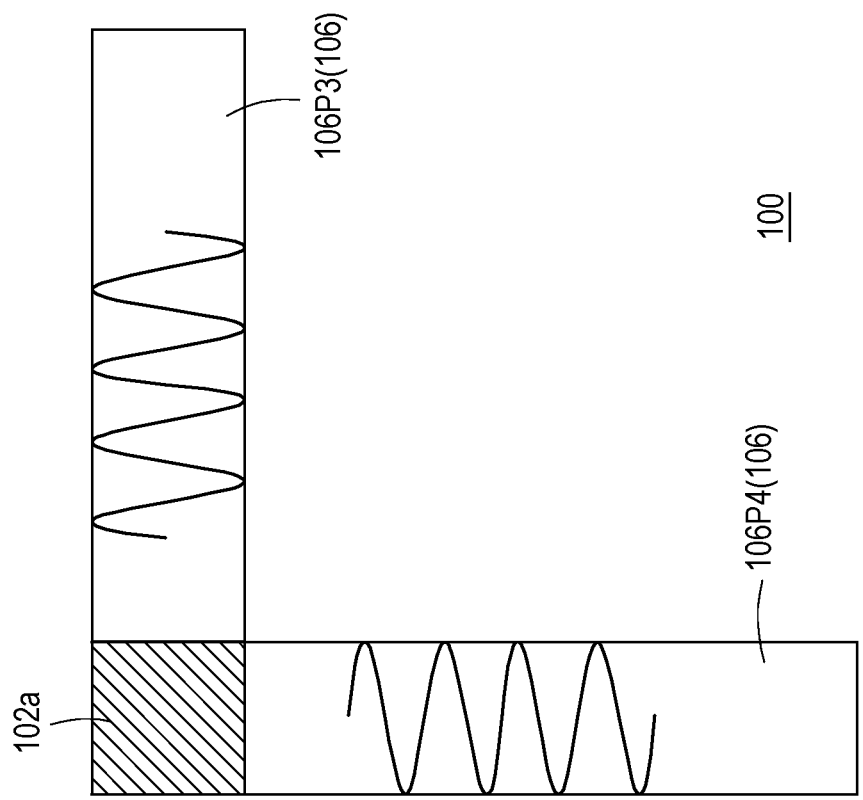

Referring to FIG. 2C, in some embodiments, the wave guide 106 fans out from two sides of the stacking structure including the electrode 102a and the underlying ferroelectric layer 104 (not shown). One protruding portion of the wave guide 106 (referred to as a protruding portion 106P3) extends along the direction X from a first side of the stacking structure, while the other protruding portion of the wave guide 106 (referred to as a protruding portion 106P4) extends along a direction Y from a second side of the stacking structure. The first side is adjacent to the second side, and the direction X is intersected with the direction Y. In these embodiments, the wave guide 106 may be formed in an "L" shape.

Figure 2D:
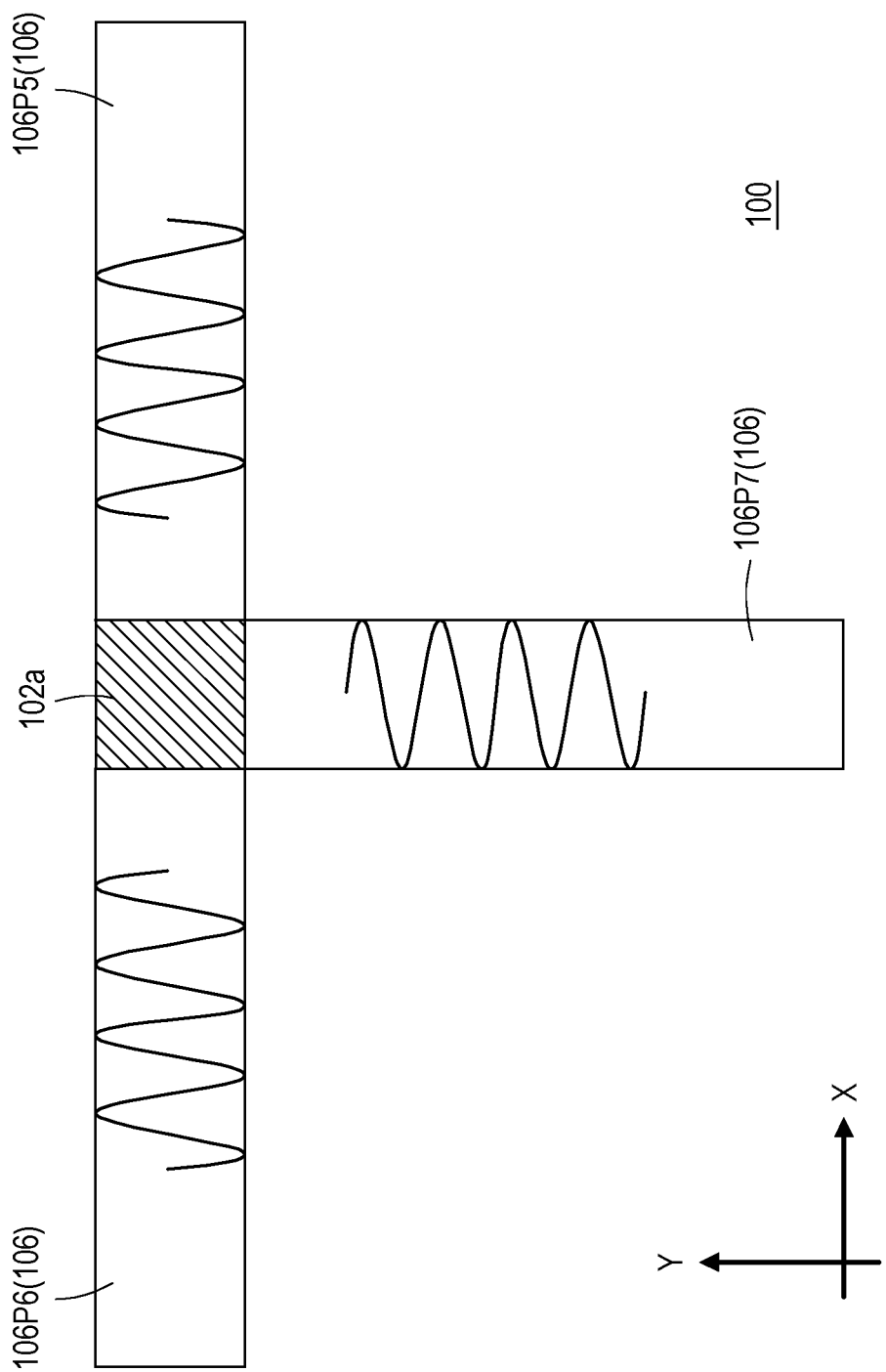
Figure 2E:
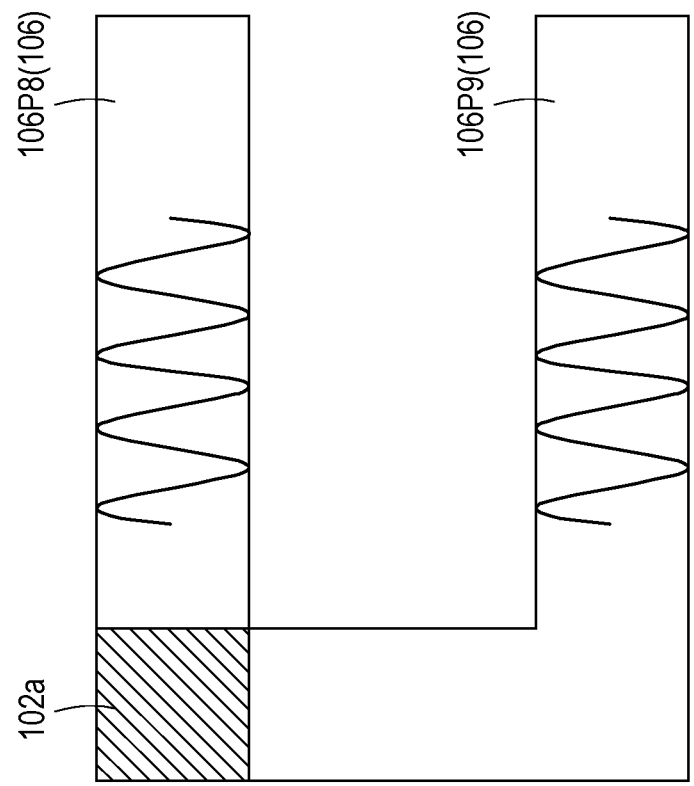

Referring to FIG. 2D, in some embodiments, the wave guide 106 fans out from three sides of the stacking structure including the electrode 102a and the underlying ferroelectric layer 104 (not shown). Protruding portions 106P5, 106P6 extends away from opposite first and second sides of the stacking structure, and a protruding portion 106P7 extends from a third side of the stacking structure adjacent to the first and second sides. As an example, the protruding portions 106P5, 106P6 may extend along the direction X, and the protruding portion 106P7 may extend along the direction Y. In these embodiments, the wave guide 106 may be formed in a "T" shape.

In some embodiments, the wave guide 106 has multiple protruding portions, and at least one of these protruding portions can have one or more bend(s). As an example shown in FIG. 2E, the wave guide 106 has two protruding portions 106P8, 106P9 laterally extending from two adjacent sides of the stacking structure including the electrode 102a and the underlying ferroelectric layer 104 (not shown). The protruding portion 106P8 may extend along the direction X. On the other hand, the protruding portion 106P9 may extend along the direction Y from the stacking structure, and may turn to the direction X at a distance from the stacking structure. It should be understood that the wave guide 106 described with reference to FIG. 2A through FIG. 2D may be otherwise formed with one or more protruding portion(s) having at least one bend.

According to the above embodiments, the ferroelectric device 100 is a transducer that can transduce an electrical wave signal to a sound wave signal, or vice versa. According to a pre-programmed polarization state, the ferroelectric device 100 can pass or invert the incoming wave signal. In other embodiments that will be described in greater details, a ferroelectric device similar to the ferroelectric device 100 can perform transduction between an electrical wave signal and a spin wave signal or a plasmon wave signal.

Figure 3:
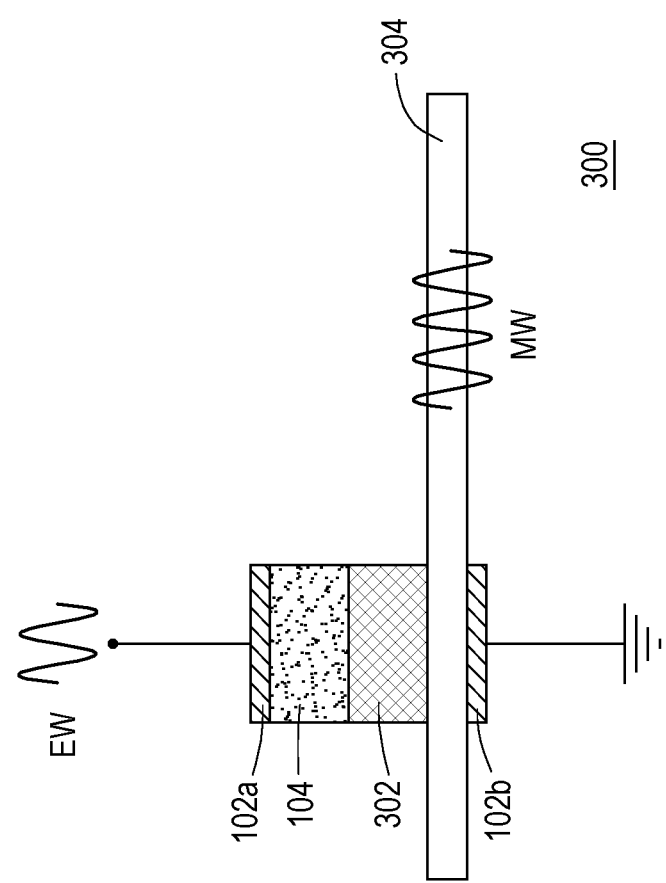
FIG. 3 is a schematic cross-sectional view illustrating a ferroelectric device, according to some embodiments of the present disclosure.

FIG. 3 is a schematic cross-sectional view illustrating a ferroelectric device 300, according to some embodiments of the present disclosure. The ferroelectric device 300 is similar to the ferroelectric device 100 described above, thus only differences between the ferroelectric devices 100, 300 will be described. The same or the like parts in the ferroelectric devices 100, 300 would not be repeated again.

Referring the FIG. 3, according to some embodiments, the ferroelectric device 300 further includes a magnetostrictive layer 302 lying between the ferroelectric layer 104 and a wave guide 304. When the ferroelectric device 300 is functioned as an input actuator, a lattice constant of the ferroelectric layer 104 changes with varying electrical field resulted from an electrical wave signal EW provided to the ferroelectric layer 104 through the electrode 102a. The change in lattice constant of the ferroelectric layer 104 is transduced to a change in magnetic anisotropy in the magnetostrictive layer 302, which produces a magnetic wave signal MW (or referred to as a spin wave signal) in the wave guide 304. In other words, an electrical energy is transduced to a mechanical energy via the ferroelectric layer 104, and the mechanical energy is further transduced to a magnetic energy via the magnetostrictive layer 302. On the other hand, when the ferroelectric device 300 is functioned as an output sensor, a magnetic wave signal MW provided to the wave guide 304 is transduced to an electrical wave signal EW by the magnetostrictive layer 302 and the ferroelectric layer 104. The magnetic wave MW may cause mechanical strain in the magnetostrictive layer 302, and such mechanical strain may stress the ferroelectric layer 104. As a result of piezoelectricity (i.e., direct piezoelectricity) of the ferroelectric layer 104, the ferroelectric layer 104 can induce an electric field while being stressed by the magnetostrictive layer 302, and a resulting electrical wave signal (e.g., the electrical wave signal EW) is output by the electrode 102a. In either way of transduction, the magnetic wave MW can be in phase or out of phase with the electrical wave signal EW, depending on the polarization state pre-programmed in the ferroelectric layer 104.

In these embodiments, the magnetostrictive layer 302 is formed of a magnetostrictive material. As examples, the magnetostrictive material may include CoFeB or FeGa. Further, in these embodiments, the wave guide 304 is formed of a magnetic material. For instance, the wave guide 304 may be formed of CoFeB, CoFe, NiFe, GaFe, CoFeO or the like. Further, as similar to the wave guide 106 described with reference to FIG. 2A through FIG. 2E, the wave guide 304 may laterally protrude from one or more sides of a stacking structure including the electrode 102a, the ferroelectric layer 104 and the magnetostrictive layer 302, and the protruding portion(s) of the wave guide 304 may or may not have bend(s).

FIG. 4A is a schematic cross-sectional view illustrating a ferroelectric device 400a, according to some embodiments of the present disclosure. The ferroelectric device 400a is similar to the ferroelectric device 100 described above, thus only differences between the ferroelectric devices 100, 400a will be described. The same or the like parts in the ferroelectric devices 100, 400a would not be repeated again.

Referring to FIG. 4A, according to some embodiments, the ferroelectric layer 104 is in contact with a wave guide 402 through a piezoelectric layer 404. As a difference from the ferroelectric layer 104, the piezoelectric layer 404 may only possess piezoelectricity (direct and inverse piezoelectricity), rather than possessing both of piezoelectricity and ferroelectricity. In other words, the piezoelectric layer 404 may not be able to be programmed with different polarization states (e.g., the polarization states P1, P2 as described with reference to FIG. 1A and FIG. 1B). When the ferroelectric device 400a is functioned as an input actuator, an electrical wave signal EW provided to the electrode 102a may be transduced to varying mechanical stress by inverse piezoelectricity of the ferroelectric layer 104, and the varying mechanical stress may be transduced back to an electrical wave signal (or referred to as a plasmon wave signal PW) by direct piezoelectricity of the piezoelectric layer 404. The resulted plasmon wave signal PW can be further directed through the wave guide 402. When the ferroelectric device 400a is functioned as an output sensor, a plasmon wave signal PW provided to the piezoelectric layer 404 through the wave guide 402 results in change of lattice constant of the piezoelectric layer 404, thus the ferroelectric layer 104 is stressed by the piezoelectric layer 404, so as to produce an electrical wave signal EW. In either case, an electrical energy is transduced to a mechanical energy, then transduced back to an electrical energy. Further, the plasmon wave signal PW can be in phase or out of phase with the electrical wave signal EW, depending on the polarization state pre-programmed in the ferroelectric layer 104.

In some embodiments, the piezoelectric layer 404 has low electrical conductivity, while the wave guide 402 has an electrical conductivity great enough for transmitting the plasmon wave PW. As an example, the piezoelectric layer 404 may be formed of an insulating lead zirconate titanate (PZT), while the wave guide 402 is formed of a conductive material, such as metal. Further, in these embodiments, the piezoelectric layer 404 and the ferroelectric layer 104 may be stacked between the electrodes 102a, 102b, and the wave guide 402 may be in lateral contact with the piezoelectric layer 404. Although only a single wave guide 402 is depicted, more wave guides 402 may be in lateral contact with multiple sides of the piezoelectric layer 404, and each of these wave guides 402 may or may not have bend(s), as similar to the wave guide 106 described with reference to FIG. 2A through FIG. 2E.

FIG. 4B is a schematic cross-sectional view illustrating a ferroelectric device 400b, according to some embodiments of the present disclosure. The ferroelectric device 400b is similar to the ferroelectric device 400a described with reference to FIG. 4A, thus only differences between the ferroelectric devices 400a, 400b will be described. The same or the like parts in the ferroelectric devices 400a, 400b would not be repeated again.

Referring to FIG. 4B, in some embodiments, a wave guide 406 is in contact with the ferroelectric layer 104 without an additional piezoelectric layer in between. In these embodiments, the wave guide 406 is electrically conductive, and is formed of a piezoelectric material only possessing piezoelectricity, rather than both of ferroelectricity and piezoelectricity. In addition to transmitting a plasmon wave PW, the wave guide 406 is further configured to transduce a varying mechanical stress to the plasmon wave PW, or vice versa. When the ferroelectric device 400b is functioned as an input actuator, an electrical wave signal EW provided to the ferroelectric layer 104 is transduced to a varying mechanical stress by inverse piezoelectricity of the ferroelectric layer 104, and then the varying mechanical stress is transduced to a plasmon wave signal PW by direct piezoelectricity of the wave guide 406. On the other hand, when the ferroelectric device 400b is functioned as an output sensor, a plasmon wave PW provided to the wave guide 406 is transduced to a varying mechanical stress by inverse piezoelectricity of the wave guide 406, and the varying mechanical stress is then transduced to an electrical wave signal EW by direct piezoelectricity of the ferroelectric layer 104. In either case, the plasmon wave signal PW can be in phase or out of phase with the electrical wave signal EW, depending on the polarization state pre-programmed in the ferroelectric layer 104.

In order to transmit the plasmon wave PW, a piezoelectric material for forming the wave guide 406 should be electrically conductive. As examples, the wave guide 406 may be formed of InN, GaN or AN. Further, as similar to the wave guide 106 described with reference to FIG. 2A through FIG. 2E, the wave guide 406 may laterally protrude from one or more sides of a stacking structure including the electrode 102a and the ferroelectric layer 104, and the protruding portion(s) of the wave guide 304 may or may not have bend(s).

Figure 4C:
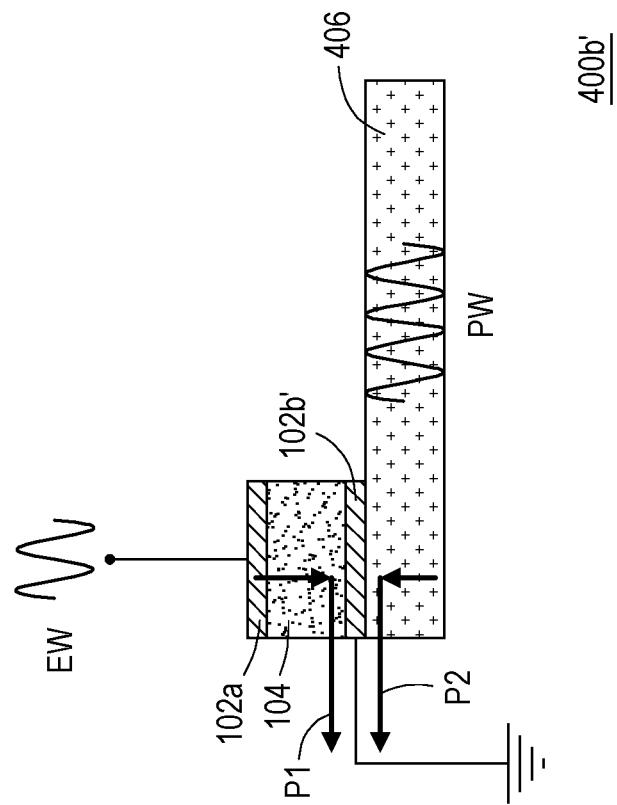
FIG. 4C is a schematic cross-sectional view illustrating a ferroelectric device, according to some embodiments of the present disclosure.

FIG. 4C is a schematic cross-sectional view illustrating a ferroelectric device 400a', according to some embodiments of the present disclosure. The ferroelectric device 400a' is similar to the ferroelectric device 400a described with reference to FIG. 4A, thus only differences between the ferroelectric devices 400a, 400a' will be described. The same or the like parts in the ferroelectric devices 400a, 400a' would not be repeated again.

Referring to FIG. 4C, in some embodiments, the ferroelectric layer 104 is sandwiched between the electrode 102a and an electrode 102b', and the electrode 102b' lies in between the ferroelectric layer 104 and the piezoelectric layer 404. The electrode 102a is configured to receive or output an electrical wave signal EW, whereas the electrode 102b' is coupled to a reference voltage, such as a ground voltage. In these embodiments, a varying mechanical stress produced by the ferroelectric layer 104 may stress the piezoelectric layer 404 through the electrode 102b' when the ferroelectric device 400a' is functioned as an input actuator, and a varying mechanical stress produced by the piezoelectric layer 404 may stress the ferroelectric layer 104 through the electrode 102b' when the ferroelectric device 400a' is functioned as an output sensor. Particularly, when the ferroelectric device 400a' is operated as an input actuator, the electrical wave signal EW may be directed to the reference voltage terminal along a path P1, without reaching the piezoelectric layer 404. Accordingly, the transduction at the piezoelectric layer 404 may be solely affected by the varying mechanical stress produced by the ferroelectric layer 104, rather than being undesirably affected by both of the varying mechanical stress produced by the ferroelectric layer 104 and the electrical wave signal EW. Similarly, when the ferroelectric device 400a' is functioned as an output sensor, the plasmon wave signal PW is directed to the reference voltage terminal along a path P2, without reaching the ferroelectric layer 104. Therefore, the transduction at the ferroelectric layer 104 may be solely affected by the varying mechanical stress produced by the piezoelectric layer 404.

Figure 4D:
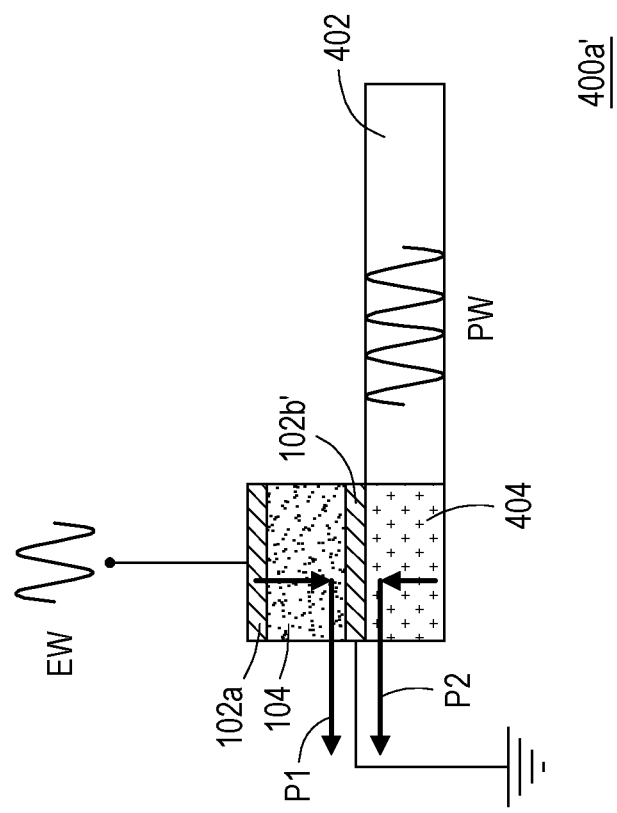
FIG. 4D is a schematic cross-sectional view illustrating a ferroelectric device, according to some embodiments of the present disclosure.

FIG. 4D is a schematic cross-sectional view illustrating a ferroelectric device 400b', according to some embodiments of the present disclosure. The ferroelectric device 400b' is similar to the ferroelectric device 400b described with reference to FIG. 4B, thus only differences between the ferroelectric devices 400b, 400b' will be described. The same or the like parts in the ferroelectric devices 400b, 400b' would not be repeated again.

Referring to FIG. 4D, in some embodiments, the ferroelectric layer 104 is sandwiched between the electrode 102a and an electrode 102b', and the electrode 102b' lies between the ferroelectric layer 104 and the wave guide 406. The electrode 102a is configured to receive or output an electrical wave signal EW, whereas the electrode 102b' is coupled to a reference voltage, such as a ground voltage. In these embodiments, a varying mechanical stress produced by the ferroelectric layer 104 may stress the wave guide 406 through the electrode 102b' when the ferroelectric device 400b' is functioned as an input actuator, and a varying mechanical stress produced by the wave guide 406 may stress the ferroelectric layer 104 through the electrode 102b' when the ferroelectric device 400b' is functioned as an output sensor. Particularly, when the ferroelectric device 400b' is operated as an input actuator, the electrical wave signal EW may be directed to the reference voltage terminal along a path P1, without reaching the wave guide 406. Accordingly, the transduction at the wave guide 406 may be solely affected by the varying mechanical stress produced by the ferroelectric layer 104, rather than being undesirably affected by both of the varying mechanical stress produced by the ferroelectric layer 104 and the electrical wave signal EW. Similarly, when the ferroelectric device 400b' is functioned as an output sensor, the plasmon wave signal PW is directed to the reference voltage terminal along a path P2, without reaching the ferroelectric layer 104. Therefore, the transduction at the ferroelectric layer 104 may be solely affected by the varying mechanical stress produced by the wave guide 406.

According to various embodiments described above, the ferroelectric device can be functioned a transducer (input actuator or output sensor), and is able to pass or invert an incoming signal, based on the polarization state pre-programmed into the ferroelectric device. In addition, a plurality of the ferroelectric devices as input actuators can be connected to other wave computing logic devices as well as a plurality of the ferroelectric device as output sensors, to form a wave computing circuit, and the wave computing circuit may be further connected to a CMOS logic circuit or an electric memory. In some embodiments that will be described in greater details, a wave computing logic device includes one or more of the ferroelectric devices as input actuators or an output sensor.

Figure 5A:
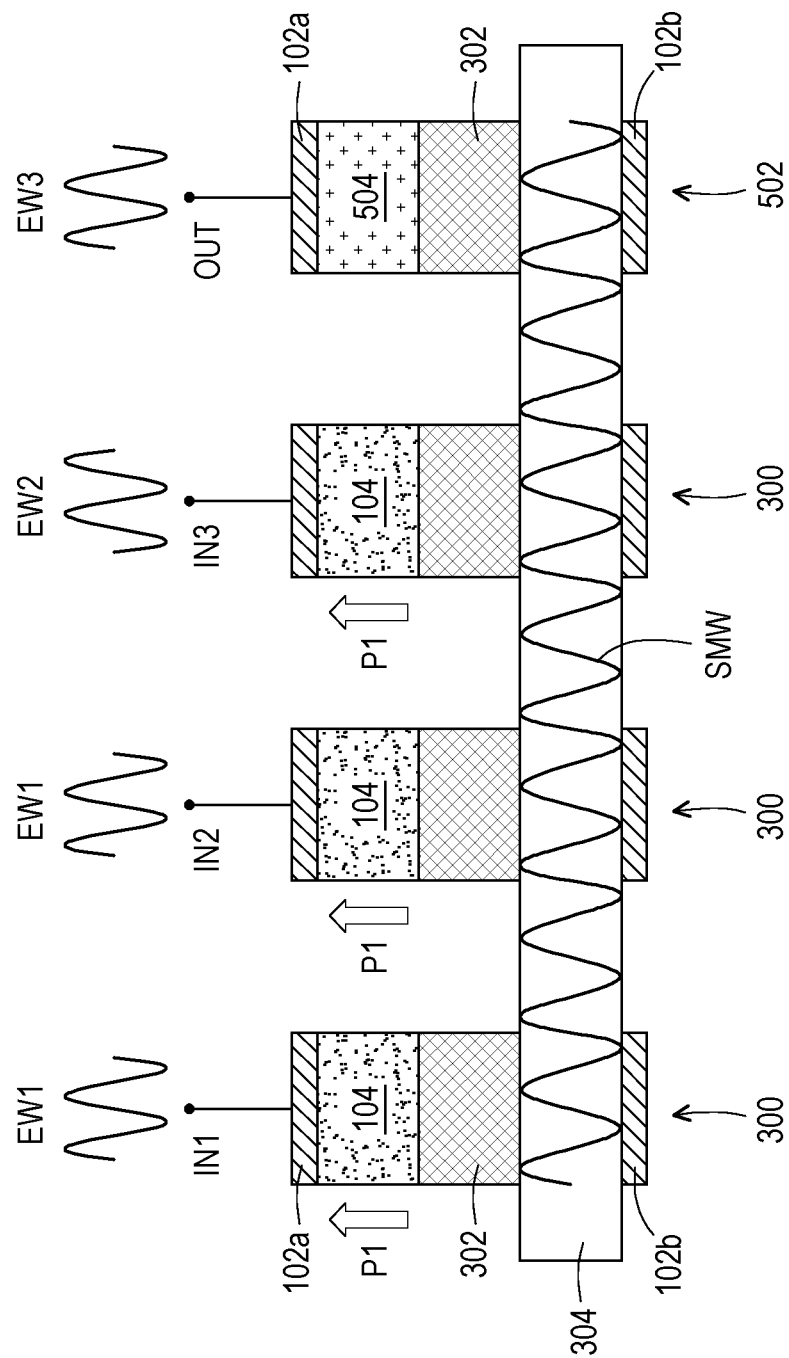
FIG. 5A is a schematic cross-sectional view illustrating a wave computing logic device, according to some embodiments of the present disclosure.

FIG. 5A is a schematic cross-sectional view illustrating a wave computing logic device 500, according to some embodiments of the present disclosure.

Referring to FIG. 3 and FIG. 5A, a plurality of the ferroelectric devices 300 as shown in FIG. 3 (e.g., 3 ferroelectric devices 300) and an output sensor 502 are interconnected, to form the wave computing logic device 500 as shown in FIG. 5A. The ferroelectric devices 300 may be connected via a shared wave guide 304. In addition, the wave guide 304 may further connect the ferroelectric devices 300 to the output sensor 502. As similar to each of the ferroelectric devices 300, the output sensor 502 includes a pair of electrodes 102a, 102b at opposite sides of the wave guide 304, and includes a magnetostrictive layer 302 lying between the wave guide 304 and the electrode 102a. As a difference from the ferroelectric devices 300, the magnetostrictive layer 302 and the electrode 102a are in contact with each other through a piezoelectric layer 504. The piezoelectric layer 504 may only possess piezoelectricity, rather than possessing both of ferroelectricity and piezoelectricity. In other words, the piezoelectric layer 504 may not be able to invert a wave signal, and may not be pre-programmed with a polarization state. In some embodiments, the piezoelectric layer 504 is formed of insulating lead zirconate titanate (PZT), InN, GaN or AN.

The wave computing logic device 500 can be operated as a majority gate that produces a standing wave having the phase of the majority of the input electrical wave signals. As an example, inputs terminals IN1, IN2, IN3 of the wave computing logic device 500 are respectively connected to the electrode 102a of one of the ferroelectric devices 300, and are configured to receive the input electrical wave signals. These input electrical wave signals may be in phase with one another, or at least one of these input electrical wave signals may be out of phase with other input electrical wave signals. For instance, input electrical wave signals EW1 in phase with each other are provided to the input terminals IN1, IN2, whereas an input electrical wave signal EW2 out of phase with respect to the input electrical wave signals EW1 is provided to the input terminal IN3. Further, the ferroelectric layers 104 of the ferroelectric devices 300 are each programmed with the same polarization state P1. Accordingly, the input electrical wave signals EW1, EW2 are transduced to magnetic waves through the ferroelectric layers 104 having the polarization state P1 and the magnetostrictive layers 302, and the magnetic waves are in phase with the input electrical wave signals EW1, EW2, respectively. Further, these magnetic waves interfere with one another in the wave guide 304, to form a standing wave signal SMW traveling along the wave guide 304. The magnetic waves transduced from the input electrical wave signal EW2 and one of the input electrical wave signal EW1 may cancel each other, such that the standing wave signal SMW is in phase with the magnetic wave transduced from the other input electrical wave signal EW1. As a result of the destructive interference, the standing wave signal SMW has the phase of the majority of the input electrical wave signals (e.g., the input electrical wave signals EW1). In some embodiments, a spacing between adjacent ferroelectric devices 300 is an integer number of the wavelength of the waves produced by the ferroelectric devices 300, in order to maximize the interference between these waves.

The standing wave signal SMW may be transduced back to an electrical wave signal EW3 through the magnetostrictive layer 302 and the piezoelectric layer 504 in the output sensor 502, and the electrical wave signal EW3 may be output from an output terminal OUT connected to the electrode 102a of the output sensor 502. Since each of the magnetostrictive layer 302 and the piezoelectric layer 504 can only perform transduction (rather than doing both of transduction and inversion), the output electrical wave signal EW3 is in phase with the standing wave signal SMW and the phase of the majority of the input electrical wave signals (e.g., the input electrical wave signals EW1).

Although the wave computing logic device 500 is depicted as having three inputs, the wave computing logic device 500 may alternatively have more than three inputs. The present disclosure is not limited to an amount of the inputs of a wave computing logic device 500. Moreover, the ferroelectric layers 104 at the inputs of the wave computing logic device 500 may be alternatively pre-programmed with different polarization states, as will be further described in details.

Figure 5B:
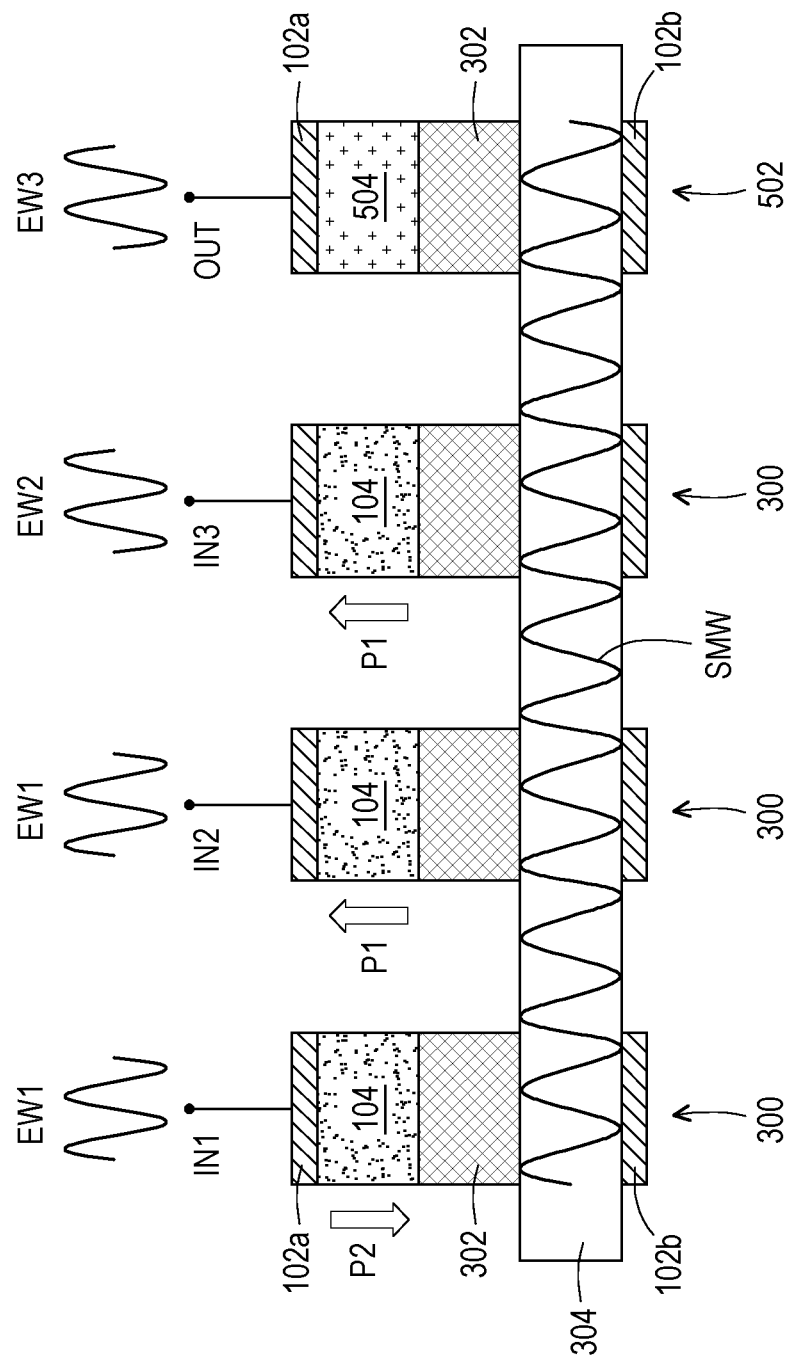
FIG. 5B is a schematic cross-sectional view illustrating a wave computing logic device having ferroelectric devices pre-programmed with different polarization states, according to some embodiments of the present disclosure.

FIG. 5B is a schematic cross-sectional view illustrating the wave computing logic device 500 having the ferroelectric devices 300 pre-programmed with different polarization states P1, P2, according to some embodiments of the present disclosure.

Referring to FIG. 5B, as another example, the ferroelectric layers 104 at the inputs of the wave computing logic device 500 are programmed with different polarization states P1, P2. Specifically, the ferroelectric layers 104 of the ferroelectric devices 300 connected to the input terminals IN2, IN3 are pre-programmed with the polarization state P1, whereas the ferroelectric layer 104 of the ferroelectric device 300 connected to the input terminal IN1 is pre-programmed with the polarization state P2. In this way, the input electrical wave signal EW1 provided to the ferroelectric device 300 connected to the input terminal IN1 is transduced and inverted, whereas other input electrical wave signals EW1, EW2 provided to the ferroelectric devices 300 connected to the input terminals IN2, IN3 are merely transduced. Due to destructive interference at the wave guide 304, the resulting standing wave signal SMW is in phase with the input electrical wave signal EW2. Therefore, the output electrical wave signal EW3 transduced from the standing wave signal SMW is in phase with the input electrical wave signal EW2 as well.

The wave computing logic device 500 as shown in FIG. 5B can be regarded as a combination of a majority gate and an inverter (at one of its inputs). By changing polarization states of the ferroelectric layers 104 at inputs of the wave computing logic device 500, more combinations of input electrical wave signals and output electrical wave signal can be obtained. If the number of inputs is n, then the total number of reconfigurable gates is 2 to the power n. In further embodiments, as will be described, the ferroelectric device 300 can be used at an output of a wave computing logic device.

Figure 6A:
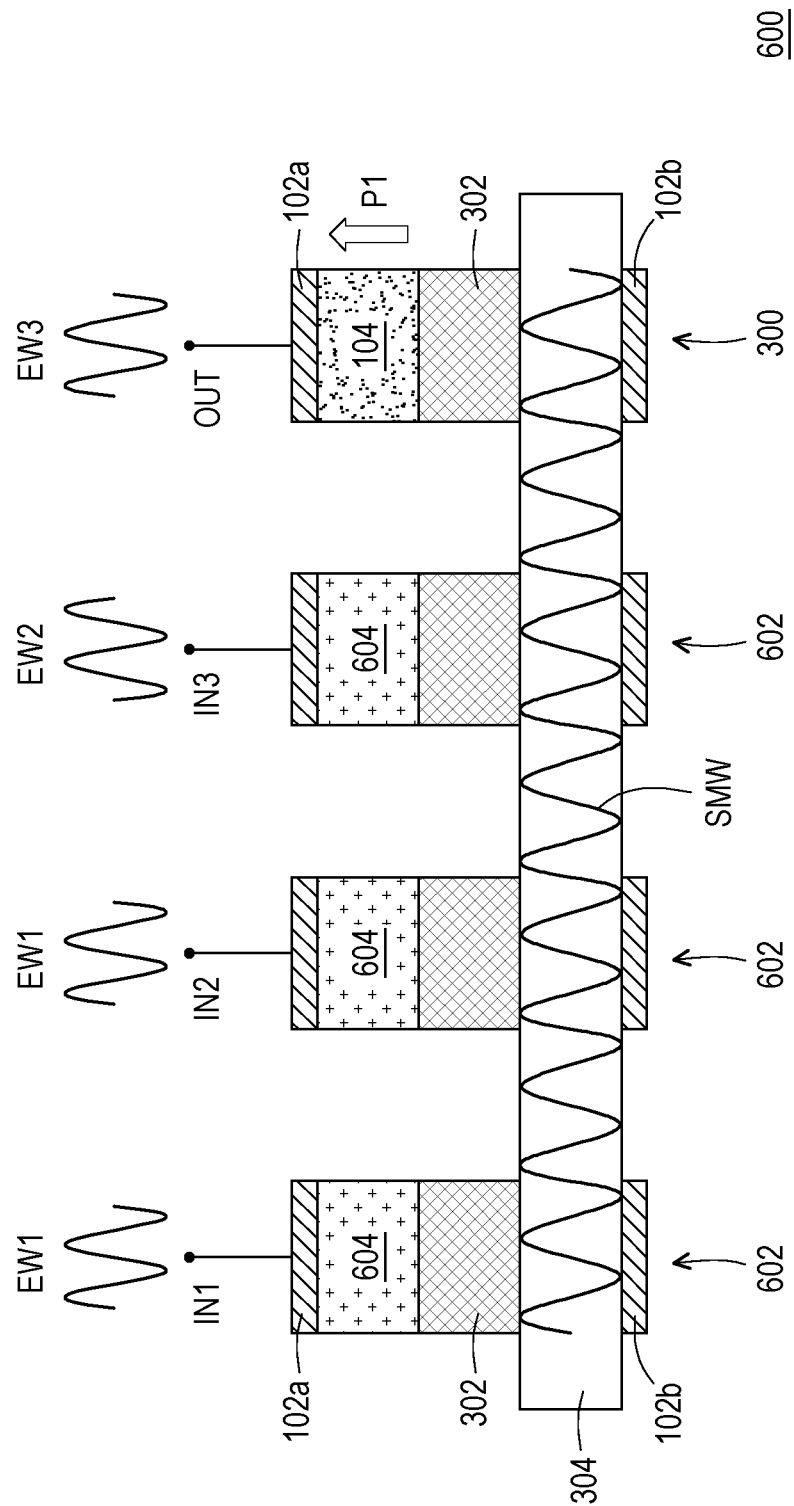
FIG. 6A is a schematic cross-sectional view illustrating a wave computing logic device, according to some embodiments of the present disclosure.

FIG. 6A is a schematic cross-sectional view illustrating a wave computing logic device 600, according to some embodiments of the present disclosure.

The wave computing logic device 600 can be functioned as a majority gate, as similar to the wave computing logic device 500 as shown in FIG. 5A. As a difference from the wave computing logic device 500, the wave computing logic device 600 includes the ferroelectric device 300 as an output sensor, and includes a plurality of input actuators 602 connected to the ferroelectric device 300 via a shared wave guide 304. As similar to the ferroelectric device 300, the input actuators 602 respectively include a pair of electrodes 102a, 102b at opposite sides of the wave guide 304, and include a magnetostrictive layer 302 lying between the wave guide 304 and the electrode 102a. In addition, the input actuator 602 further includes a piezoelectric layer 604 sandwiched between the electrode 102a and the piezoelectric layer 302. The piezoelectric layer 604 may only possess piezoelectricity, rather than possessing both of ferroelectricity and piezoelectricity. In other words, as different from the ferroelectric layer 104 in the ferroelectric device 300, the piezoelectric layer 604 in the input actuator 602 may not be able to invert a wave signal, and may not be pre-programmed with a polarization state. In some embodiments, the piezoelectric layer 604 is formed of insulating lead zirconate titanate (PZT), InN, GaN or AN.

Input electrical wave signals provided to the input actuators 602 may be transduced by the input actuators 602 and interfered with one another to form a standing wave signal in the wave guide 304, then the standing wave signal is transduced to an output electrical wave signal by the ferroelectric device 300. Further, the output electrical wave signal can be in phase or out of phase with the standing wave signal, depending on the polarization state of the ferroelectric layer 104 in the ferroelectric device 300. As an example, the wave computing logic device 600 includes 3 input actuators 602, and input terminals IN1, IN2, IN3 of the wave computing logic device 600 are respectively connected to the electrode 102a of one of the input actuators 602 and configured to receive input electrical wave signals. These input electrical wave signals may be in phase with one another, or at least one of these input electrical wave signal may be out of phase with other input electrical wave signals. For instance, input electrical wave signals EW1 in phase with each other are provided to the input terminals IN1, IN2, whereas an input electrical wave signal EW2 out of phase with respect to the input electrical wave signals EW1 is provided to the input terminal IN3. The input electrical wave signals EW1, EW2 are transduced to magnetic wave signals by the piezoelectric layers 604 and the magnetostrictive layers 302 in the input actuators 602, without being inversed. Further, the magnetic wave signals interfere with each other in the wave guide 304, and the resulting standing wave signal SMW having the phase of the majority of the input electrical wave signals EW1, EW2 travels along the wave guide 304. The magnetostrictive layer 302 and the ferroelectric layer 104 in the ferroelectric device 300 transduce the standing wave signal SMW to an output electrical wave signal EW3. As an example illustrated in FIG. 6A, the ferroelectric layer 104 is pre-programmed with the polarization state P1, and the output electrical wave signal EW3 is in phase with the standing wave signal SMW, which should be the phase of the majority of the input electrical wave signals EW1, EW2. In some embodiments, a spacing between adjacent input actuators 602 is an integer number of the wavelength of the waves produced by the input actuators 602, in order to maximize the interference between these waves.

Figure 6B:
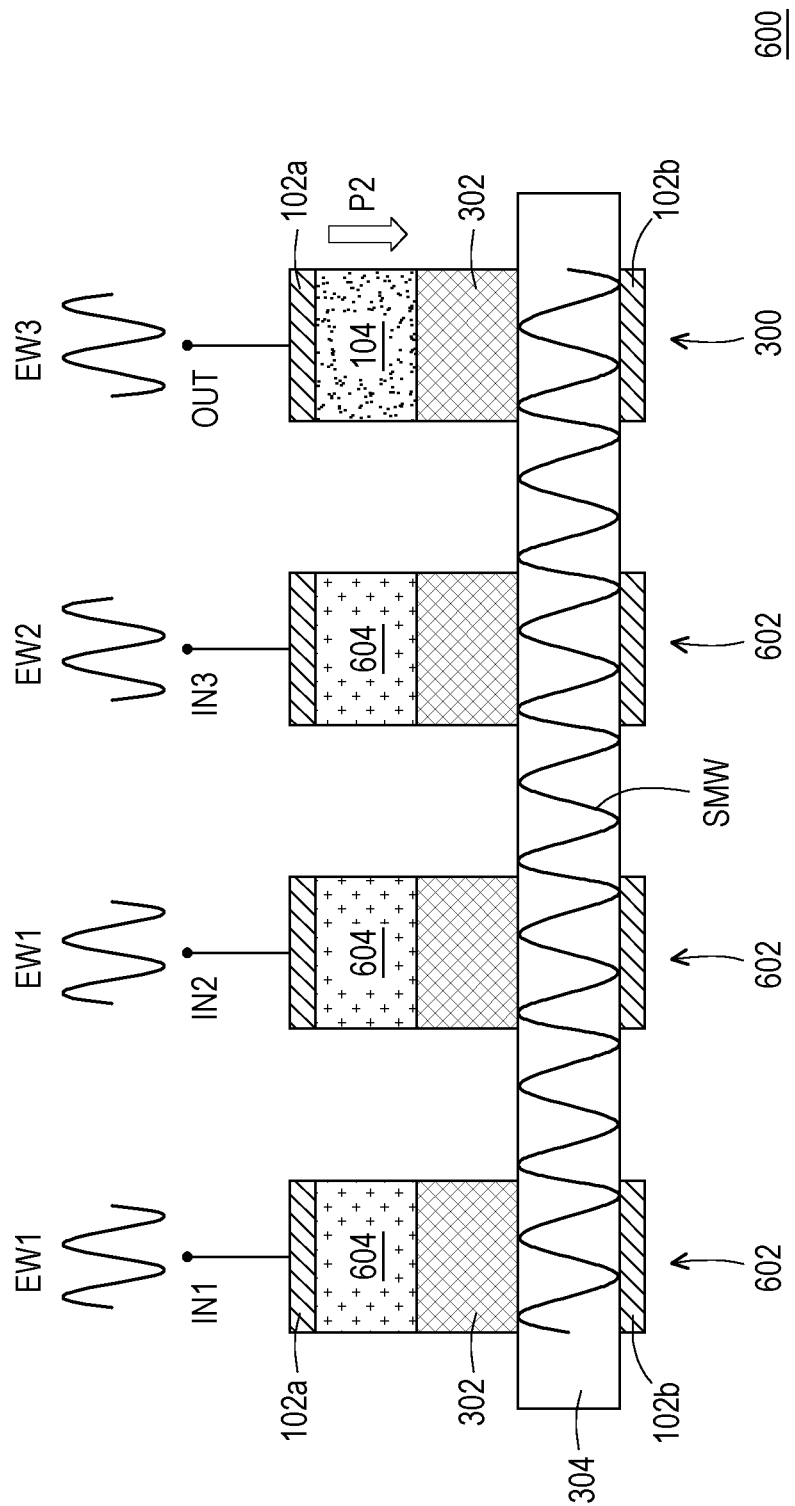
FIG. 6B is a schematic cross-sectional view illustrating a wave computing logic device having ferroelectric device pre-programmed with another polarization state, according to some embodiments of the present disclosure.

FIG. 6B is a schematic cross-sectional view illustrating the wave computing logic device 600 having the ferroelectric device 300 pre-programmed with the polarization state P2, according to some embodiments of the present disclosure.

Referring to FIG. 6B, as another example, the ferroelectric layer 104 in the ferroelectric device 300 of the wave computing logic device 600 is programmed with the polarization state P2. Accordingly, the standing wave signal SMW is transduced and inverted by the ferroelectric device 300, thus the resulting output electrical wave signal EW3 is out of phase with the majority of the input electrical wave signals EW1, EW2. Therefore, the wave computing logic device 600 as shown in FIG. 6B can be regarded as a combination of a majority gate and an inverter (at its output).

It should be understood that, the magnetostrictive layers 302 shown in FIG. 5A, FIG. 5B, FIG. 6A and FIG. 6B may be omitted, such that the standing wave signal resulted in the wave guide 304 should be a sound wave signal. Alternatively, the magnetostrictive layers 302 in the ferroelectric devices 300 shown in FIG. 5A, FIG. 5B may be replaced by piezoelectric layers, and the magnetostrictive layer 302 in the output sensor 502 shown in FIG. 5A and FIG. 5B may be omitted. Similarly, the magnetostrictive layers 302 in the input actuators 602 shown in FIG. 6A and FIG. 6B may be replaced by piezoelectric layers, and the magnetostrictive layer 302 in the ferroelectric device 300 shown in FIG. 6A and FIG. 6B may be omitted. In these alternative embodiments, the standing wave signal resulted in the wave guide 304 should be a plasmon wave.

In addition to be used in a wave computing logic device, the ferroelectric device according to various embodiments may be used to generate coherent differential wave signals.

Figure 7A:
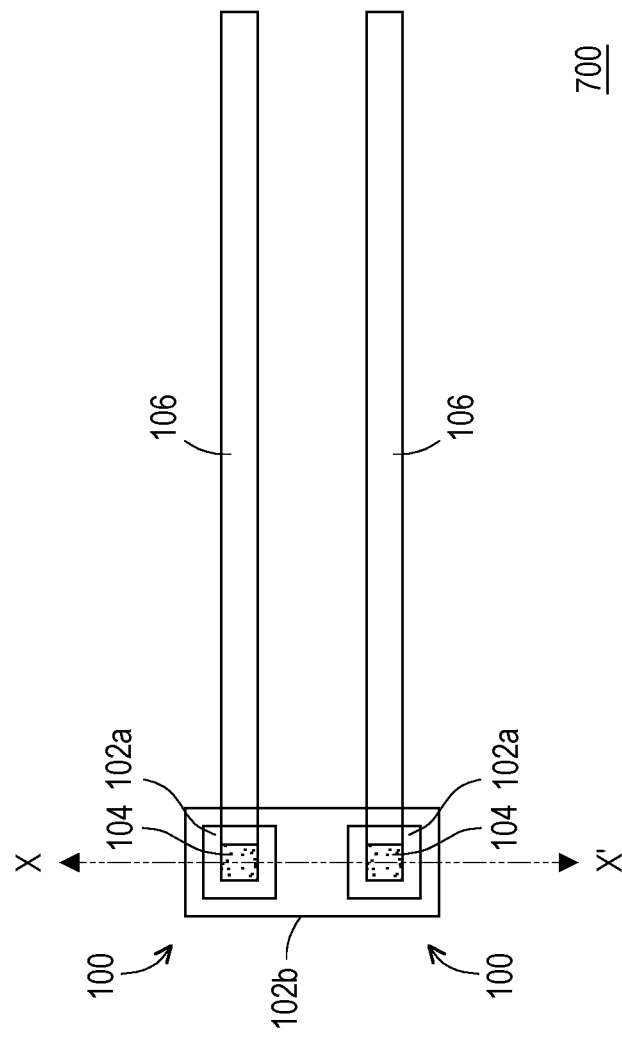
FIG. 7A is a schematic plan view illustrating a differential wave signal generator, according to some embodiments of the present disclosure.
Figure 7B:
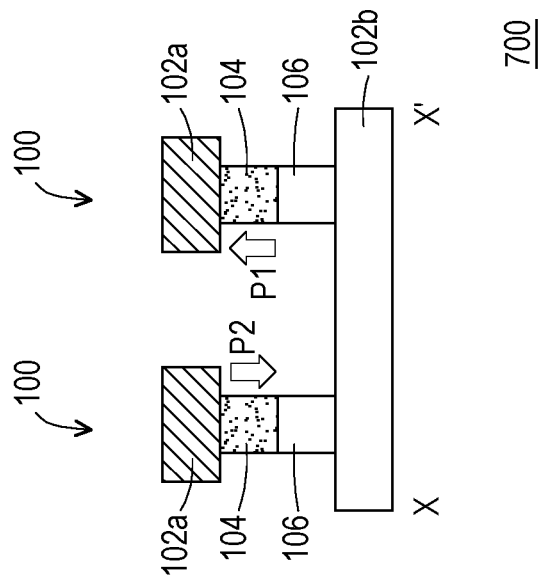
FIG. 7B is a schematic cross-sectional view along X-X' line shown in FIG. 7A.

FIG. 7A is a schematic plan view illustrating a differential wave signal generator 700, according to some embodiments of the present disclosure. FIG. 7B is a schematic cross-sectional view along X-X' line shown in FIG. 7A.

Referring to FIG. 7A and FIG. 7B, the differential wave signal generator 700 includes two of the ferroelectric devices 100 as shown in FIG. 1A and FIG. 1B. The ferroelectric devices 100 may be connected by a shared electrode 102b, while the electrode 102a, the ferroelectric layer 104 and the wave guide 106 in one of the ferroelectric device 100 are laterally spaced apart from the electrode 102a, the ferroelectric layer 104 and the wave guide 106 in the other ferroelectric device 100. In some embodiments, the wave guides 106 may be substantially parallel with each other. Further, the ferroelectric layer 104 in one of the ferroelectric devices 100 is pre-programmed with the polarization state P1, while the ferroelectric layer 104 in the other ferroelectric device 100 is pre-programmed with the polarization state P2.

The electrodes 102a of the ferroelectric devices 100 may be configured to receive identical electrical wave signals. One of the electrical wave signals is transduced to a sound wave signal in phase with the electrical wave signals through the ferroelectric layer 104 pre-programmed with the polarization state P1, whereas the other electrical wave signal is transduced to a sound wave signal out of phase with the electrical wave signals through the ferroelectric layer 104 pre-programmed with the polarization state P2. In other words, two sound wave signals are generated which are out of phase. As a result, a pair of differential wave signals can be output via the wave guides 106.

It should be understood that, when both ferroelectric layers 104 are pre-programmed with the same polarization state, sound wave signals can be generated along the wave guides 106 which are in phase. Further, in other embodiments, a magnetostrictive layer or a piezoelectric layer may be further inserted in between each ferroelectric layer 104 and the contacted wave guide 106, such that the resulting wave signals can be magnetic wave signals or plasmon wave signals.

Figure 8:
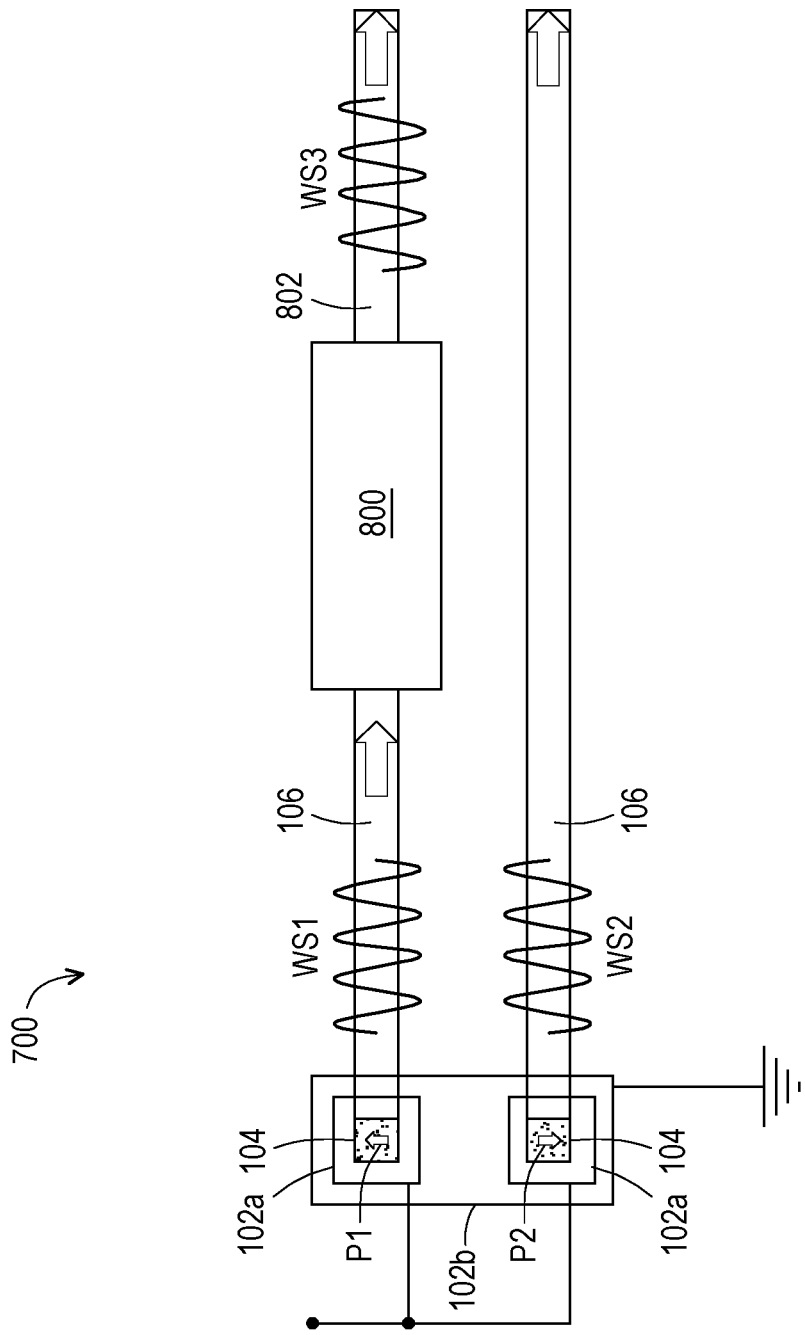
FIG. 8 is a schematic diagram illustrating that the differential wave signal generator as shown in FIG. 7 is further connected to a wave computing logic device, according to some embodiments of the present disclosure.

FIG. 8 is a schematic diagram illustrating that the differential wave signal generator 700 as shown in FIG. 7 is further connected to a wave computing logic device 800, according to some embodiments of the present disclosure.

Referring to FIG. 8, a pair of differential wave signals WS1, WS2 are generated along the wave guides 106 of the differential wave signal generator 700 as shown in FIG. 7. One of the wave guides 106 is further connected to a wave computing logic device 800, and the wave signal traveled along this wave guide 106 (e.g., the wave signal WS1) is provided as an input of a logic operation performed by the wave computing logic device 800. Correspondingly, the wave computing logic device 800 may output a wave signal WS3 along a wave guide 802. By comparing the wave signal WS3 with the wave signal WS2, the phase of the wave signal WS3 can be identified. The wave signal WS3 may be either in phase with the wave signal WS2, or out of phase with the wave signal WS2. As an example, the wave computing logic device 800 may be an inverter, such that the wave signal WS3 may be out of phase with respect to the wave signal WS1, and may be in phase with the wave signal WS2. As another example, the wave computing logic device 800 is a majority gate, or a combination of majority gate and an inverter (such as the wave computing logic devices 500, 600 as described with reference to FIG. 5A, FIG. 5B, FIG. 6A and FIG. 6B), and more input wave signals may be provided to the wave computing logic device 800.

Figure 9:
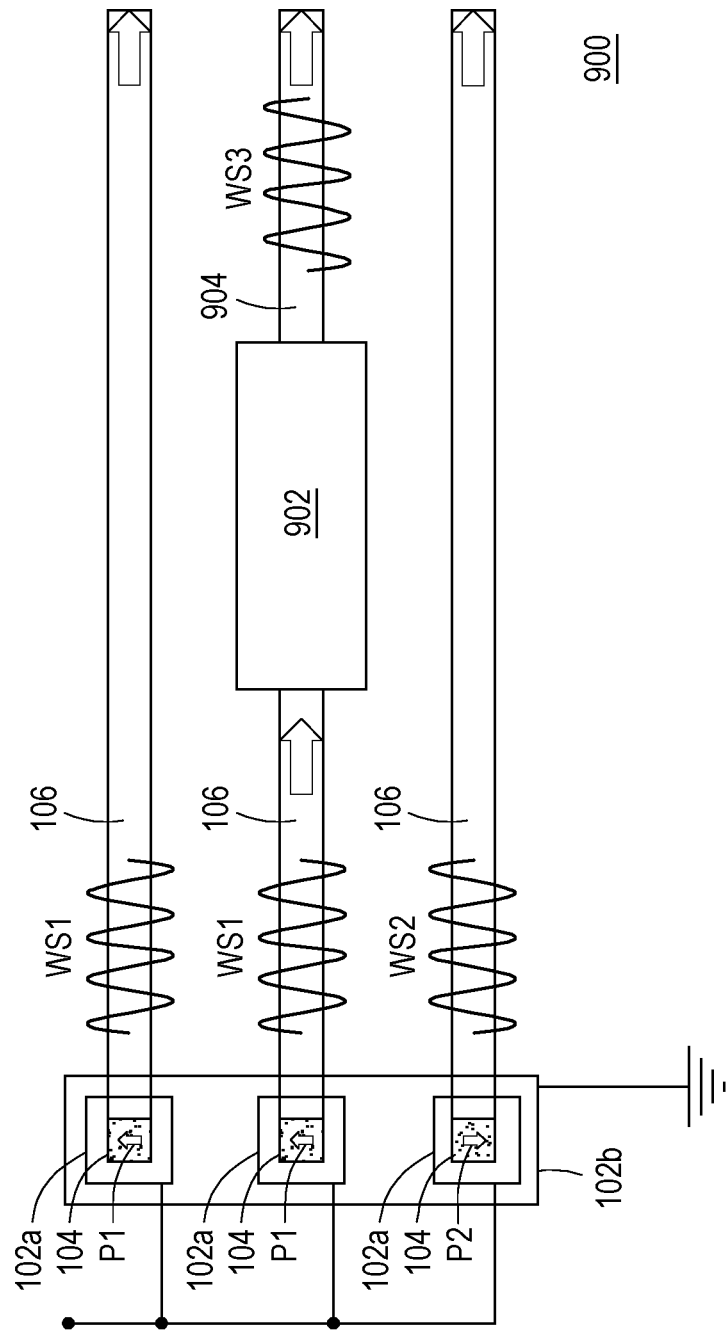
FIG. 9 is a schematic diagram illustrating an error correction device used in a wave computing circuit, according to some embodiments of the present disclosure.

FIG. 9 is a schematic diagram illustrating an error correction device 900 used in a wave computing circuit, according to some embodiments of the present disclosure.

Referring to FIG. 9, the error correction device 900 may include three of the ferroelectric devices 100 as shown in FIG. 1A and FIG. 1B. The ferroelectric devices 100 may be connected by a shared electrode 102b, while the electrode 102a, the ferroelectric layer 104 and the wave guide 106 in each of the ferroelectric devices 100 are laterally spaced apart from the electrode 102a, the ferroelectric layer 104 and the wave guide 106 in another one of the ferroelectric device 100. In some embodiments, the wave guides 106 may be substantially parallel with one another. Further, the ferroelectric layers 104 in two of the ferroelectric devices 100 are pre-programmed with the polarization state P1, while the ferroelectric layer 104 in the other ferroelectric device 100 is pre-programmed with the polarization state P2.

The electrodes 102a of the ferroelectric devices 100 may be configured to receive identical electrical wave signals. Two of the electrical wave signals are transduced to wave signals WS1, which are in phase with the input electrical wave signals, by the ferroelectric layers 104 pre-programmed with the polarization state P1. The other electric wave signal is transduced to a wave signal WS2 which is out of phase with the input electrical wave signals, by the ferroelectric layer 104 pre-programmed with the polarization state P2.

A wave computing logic device 902 may be connected to one of the wave guides 105 along which one of the wave signals WS1 travels, such that this wave signal WS1 is provided as an input of a logic operation performed by the wave computing logic device 902. Correspondingly, the wave computing logic device 902 outputs a wave signal WS3 along a wave guide 904. Ideally, the wave signal WS3 is either in phase with the wave signals WS1, or with the wave signal WS2. However, in certain cases, the wave signal WS3 may lose coherence with the wave signals WS1, WS2, such that the wave signal WS3 may have a phase shift greater than 0° and less than 180°, with respect to each of the wave signals WS1, WS2. In order to correct this error, the wave signal WS3 is compared with each of the wave signals WS1, WS2, to determine the phase of the wave signal WS3 is closer to which of the phase of the wave signal WS1 and the phase of the wave signal WS2. According to the comparison result, a corrected wave signal (in phase with one of the wave signals WS1, WS2) can be output. According to some embodiments, a majority gate (e.g., the majority gate as described with reference to FIG. 5A) can be used for comparing the wave signals WS1, WS2, WS3.

It should be understood that, each of the ferroelectric devices 100 in the error correction device 900 can be replaced by the ferroelectric device 300 as shown in FIG. 3, the ferroelectric device 400a shown in FIG. 4A, the ferroelectric device 400b shown in FIG. 4B, the ferroelectric device 400a' shown in FIG. 4C or the ferroelectric device 400b' shown in FIG. 4D.

The ferroelectric devices used in various wave computing devices as described above can be formed in a semiconductor die. In some embodiments, the wave computing components are integrated with CMOS circuits in the same semiconductor die.

Figure 10:
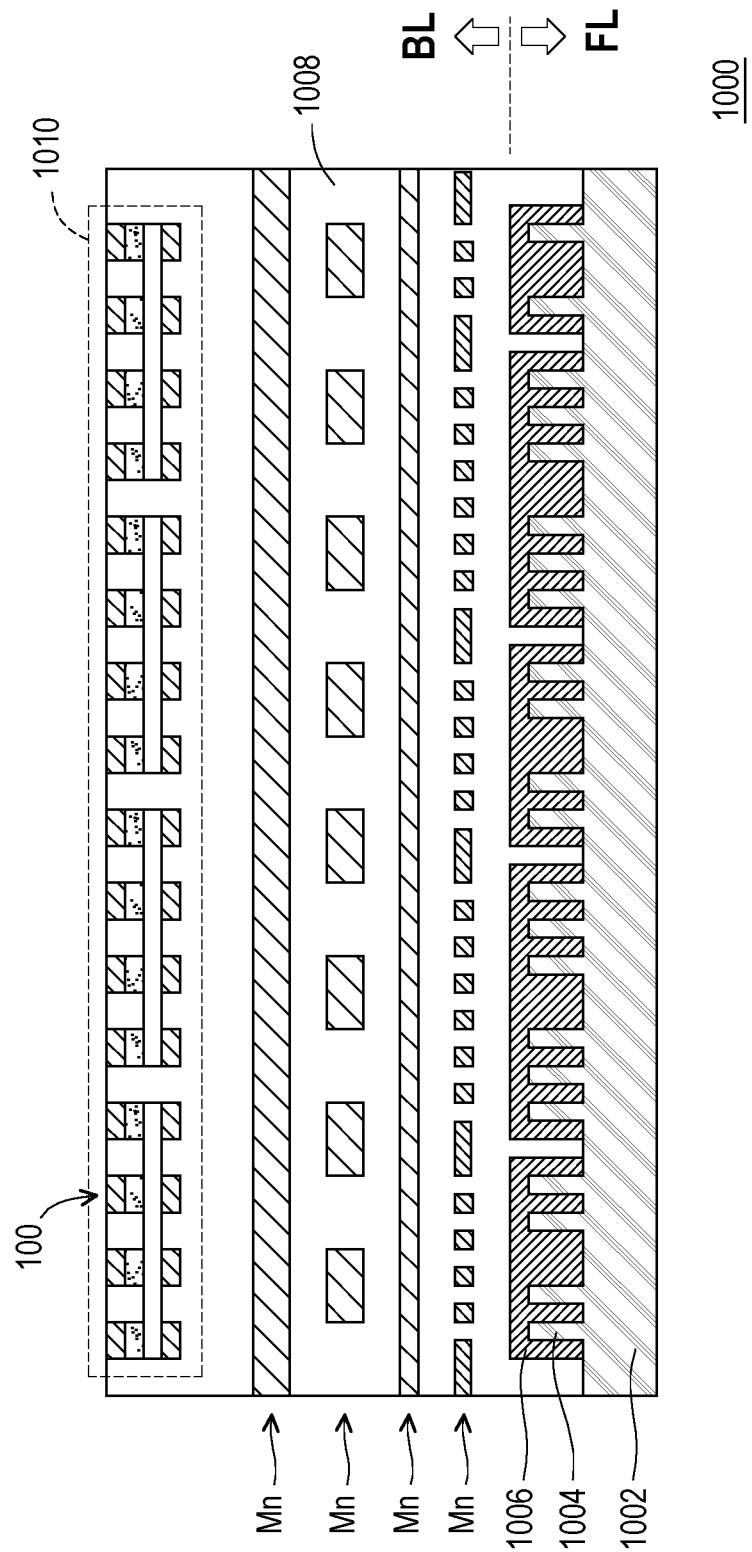
FIG. 10 is a schematic cross-sectional view illustrating a semiconductor die, according to some embodiments of the present disclosure.

FIG. 10 is a schematic cross-sectional view illustrating a semiconductor die 1000, according to some embodiments of the present disclosure.

Referring to FIG. 10, the semiconductor die 1000 is built on a semiconductor substrate 1002. A front-end-of-line (FEOL) structure FL in the semiconductor die 1000 may include a plurality of CMOS transistors formed on the semiconductor substrate 1002. According to some embodiments, these CMOS transistors have channel structures 1004 standing on the semiconductor substrate 1002, and include gate structures 1006 covering and intersected with the channel structures 1004. In addition to the FEOL structure FL, the semiconductor die 1000 also includes a back-end-of-line (BEOL) structure BL formed on the FEOL structure FL. The BEOL structure BL may include a stack of dielectric layers 1008 formed on the semiconductor substrate 1002 and covering the FEOL structure FL, and include multiple metallization tiers Mn embedded in the stack of dielectric layers 1008. Bottommost metallization layer(s) Mn may provide local interconnections for the CMOS transistors, while upper metallization layers Mn may provide global interconnections.

Moreover, a wave computing circuit 1010 is also embedded in the BEOL structure BL. The wave computing circuit 1010 is formed in the stack of dielectric layers 1008. In some embodiments, the wave computing circuit 1010 is formed over several metallization tiers Mn. Although not shown, more metallization tiers may be further disposed on the wave computing circuit 1010. The wave computing circuit 1010 may include input actuators, output sensors and various wave computing logic devices, and may also include differential wave signal generators and/or error correction devices. As described above, the ferroelectric device according to various embodiments (e.g., the ferroelectric device 100) can be used in each of the input actuators, output sensors, wave computing logic devices, the differential signal generators and error correction devices. Further, the wave computing circuit 1010 may be connected to the CMOS transistors in the FEOL structure FL through the metallization tiers Mn lying in between. Therefore, computing in the semiconductor die 1000 may be executed by a combination of a CMOS circuit including the CMOS transistors and the wave computing circuit 1010.

As above, a ferroelectric device used in a wave computing circuit is provided. The ferroelectric device includes a ferroelectric layer configured to transduce an electrical wave signal to a varying mechanical stress by inverse piezoelectricity, and the varying mechanical stress may result in a sound wave, a plasmon wave or a magnetic wave. Alternatively, the ferroelectric layer can transduce a varying mechanical stress resulted from a sound wave, a plasmon wave or a magnetic wave, to an electrical wave signal by direct piezoelectricity. Further, the output wave signal can be in phase, or 180° out of phase with respect to the input wave signal, depending on a polarization state pre-programmed in the ferroelectric layer. In other words, the ferroelectric device can transduce a wave signal without inverting the wave signal, or can transduce and invert a wave signal. Further, the inversion of wave signal can be performed right at the ferroelectric device, without traveling along a delay line or interfering with a reference wave signal. Therefore, the ferroelectric device is able to invert a wave signal on the spot. According to some embodiments, the ferroelectric device is functioned as a wave transducer, which could be further capable of inverting a wave signal. In other embodiments, the ferroelectric device can be used in a majority gate, a differential wave signal generator, an error correction device or another wave computing device.

In an aspect of the present disclosure, a ferroelectric device is provided. The ferroelectric device comprises: first and second electrodes; a ferroelectric layer, disposed between the first and second electrodes, and configured to transduce an electrical wave signal to a varying mechanical stress by piezoelectricity, or vice versa, wherein a first polarization state or a second polarization state opposite to the first polarization state is programmed in the ferroelectric layer; and a wave guide, in contact with the ferroelectric layer, and configured to transmit a wave signal resulted from or resulting the varying mechanical stress, wherein the wave signal is in phase with the electrical wave signal when the ferroelectric layer is programmed with the first polarization state, and the wave signal is coherent and out of phase with the electrical wave signal when the ferroelectric layer is programmed with the second polarization state.

In another aspect of the present disclosure, a wave computing device is provided. The wave computing device comprises: a ferroelectric device and a wave transducer connected to each other through a wave guide, wherein the ferroelectric device comprises: first and second electrodes; and a ferroelectric layer, in contact with the wave guide and located between the first and second electrodes, wherein the ferroelectric layer is configured to transduce an electrical wave signal to a varying mechanical stress by piezoelectricity, or vice versa, and wherein the ferroelectric layer is programmed with a first polarization state or a second polarization state opposite to the first polarization state.

In yet another aspect of the present disclosure, a wave computing device is provided. The wave computing device comprises: a first ferroelectric layer and a second ferroelectric layer, laterally separated from each other wherein the first ferroelectric layer is programmed with a first polarization state, and the second ferroelectric layer is programmed with a second polarization state opposite to the first polarization state; a first wave guide and a second wave guide, wherein the first wave guide is in contact with the first ferroelectric layer, and the second wave guide is in contact with the second ferroelectric layer; a first electrode and a second electrode, configured to receive identical electrical wave signals, wherein the first ferroelectric layer lies between the first electrode and the first wave guide, and the second ferroelectric layer lies between the second electrode and the second wave guide; and a common electrode, disposed at a side of the first and second wave guides facing away from the first and second ferroelectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric device, comprising:
   first and second electrodes;
   a ferroelectric layer, disposed between the first and second electrodes, and configured to transduce an electrical wave signal to a varying mechanical stress by piezoelectricity, or vice versa, wherein a first polarization state or a second polarization state opposite to the first polarization state is programmed in the ferroelectric layer; and
   a wave guide, configured to transmit a wave signal resulted from or resulting the varying mechanical stress, wherein the wave signal is in phase with the electrical wave signal when the ferroelectric layer is programmed with the first polarization state, and the wave signal is out of phase with the electrical wave signal when the ferroelectric layer is programmed with the second polarization state.

2. The ferroelectric device according to claim 1, wherein the ferroelectric layer is in contact with the wave guide through a magnetostrictive layer.

3. The ferroelectric device according to claim 2, wherein the wave signal is a magnetic wave signal, and the wave guide is formed of a magnetic material.

4. The ferroelectric device according to claim 1, wherein the ferroelectric layer is in contact with the wave guide through a piezoelectric layer possessing piezoelectricity, rather than both of piezoelectricity and ferroelectricity.

5. The ferroelectric device according to claim 4, wherein the wave signal is a plasmon wave signal, and the wave guide is electrically conductive.

6. The ferroelectric device according to claim 1, wherein the wave guide is formed of a piezoelectric material, and is electrically conductive.

7. The ferroelectric device according to claim 1, wherein the ferroelectric layer and the wave guide extend between the first and second electrodes.

8. The ferroelectric device according to claim 1, wherein one of the first and second electrodes extends between the ferroelectric layer and the wave guide.

9. The ferroelectric device according to claim 1, wherein the wave guide laterally protrudes with respect to one or more sides of the ferroelectric layer.

10. The ferroelectric device according to claim 9, wherein a laterally protruding portion of the wave guide has at least one bend along its extending direction.

11. A wave computing device, comprising:
    a ferroelectric device and a wave transducer connected to each other through a wave guide, wherein the ferroelectric device comprises:
    first and second electrodes; and
    a ferroelectric layer, located between the first and second electrodes, wherein the ferroelectric layer is configured to transduce an electrical wave signal to a varying mechanical stress by piezoelectricity, or vice versa, and wherein the ferroelectric layer is programmed with a first polarization state or a second polarization state opposite to the first polarization state.

12. The wave computing device according to claim 11, wherein the ferroelectric device is an input actuator and the wave transducer is an output sensor, wherein the electrical wave signal is an input electrical wave signal, and wherein the ferroelectric device transduces the input electric wave signal to a wave signal resulted from the varying mechanical stress.

13. The wave computing device according to claim 12, further comprising more of the ferroelectric devices connected to the wave transducer through the wave guide and producing additional wave signals based on additional input electrical wave signals.

14. The wave computing device according to claim 13, wherein the wave signal and the additional wave signals interfere with one another in the wave guide, to produce a standing wave signal traveling along the wave guide, and wherein the wave transducer translates the standing wave signal to an output electrical signal.

15. The wave computing device according to claim 14, wherein each of the standing wave signal and the output electrical wave signal has a phase of a majority of the input electrical wave signal and the additional input electrical wave signals.

16. The wave computing device according to claim 11, wherein the ferroelectric device is an output sensor and the wave transducer is an input actuator, wherein the electrical wave signal is an output electrical wave signal, and wherein the ferroelectric device transduces a standing wave signal traveling along the wave guide and resulting the varying mechanical stress, to the output electrical wave signal.

17. The wave computing device according to claim 16, further comprising more of the input actuators, wherein the input actuators are connected to the ferroelectric device through the wave guide, and produce wave signals based on input electrical wave signals, and wherein the wave signals interfere with one another to form the standing wave signal.

18. A wave computing device, comprising:
    a wave guide;
    a ferroelectric device, wherein the ferroelectric device comprises:
    a first electrode;
    a second electrodes; and
    a ferroelectric layer, wherein the first electrode is disposed at a first side of the wave guide, the second electrode and the ferroelectric layer are disposed at a second side of the wave guide, the second side is opposite to the first side, the ferroelectric layer is located between the wave guide and the second electrode, the ferroelectric layer is configured to transduce an electrical wave signal to a varying mechanical stress by piezoelectricity, or vice versa, and wherein the ferroelectric layer is programmed with a first polarization state or a second polarization state opposite to the first polarization state; and an output sensor connected to the ferroelectric device through the wave guide.

19. The wave computing device according to claim 18, wherein the ferroelectric device further comprises a magnetostrictive layer between the wave guide 304 and the second electrode.

20. The wave computing device according to claim 18, wherein the output sensor comprises a piezoelectric layer sandwiched by a pair of electrodes.

* * * * *